(12) United States Patent
Wicklein

(10) Patent No.: US 10,114,590 B1
(45) Date of Patent: *Oct. 30, 2018

(54) METHODS FOR THREE-DIMENSIONAL NONVOLATILE MEMORY THAT INCLUDE MULTI-PORTION WORD LINES

(71) Applicant: SANDISK TECHNOLOGIES LLC, Plano, TX (US)

(72) Inventor: Sebastian J. M. Wicklein, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/609,592

(22) Filed: May 31, 2017

(51) Int. Cl.
| H01L 27/24 | (2006.01) |
| G06F 3/06 | (2006.01) |
| G11C 8/14 | (2006.01) |
| G11C 7/18 | (2006.01) |
| H01L 21/02 | (2006.01) |

(52) U.S. Cl.
CPC ............. G06F 3/0688 (2013.01); G11C 7/18 (2013.01); G11C 8/14 (2013.01); H01L 21/02389 (2013.01); H01L 21/02403 (2013.01)

(58) Field of Classification Search
CPC . H01L 27/115; H01L 27/1052; H01L 127/24; H01L 45/04
See application file for complete search history.

(56) References Cited

U.S. PATENT DOCUMENTS

| 9,153,705 B2 * | 10/2015 | Zhang ................ H01L 29/7827 |
| 9,768,180 B1 * | 9/2017 | Zhou .................... H01L 27/115 |
| 2013/0082232 A1 | 4/2013 | Wu et al. |
| 2017/0288140 A1 | 10/2017 | Karpov et al. |

FOREIGN PATENT DOCUMENTS

WO 2016048330 A1 3/2016

OTHER PUBLICATIONS

International Search Report & Written Opinion dated Jun. 7, 2018 in International Patent Application No. PCT/US2018/021062.

* cited by examiner

*Primary Examiner* — Quoc Hoang
(74) *Attorney, Agent, or Firm* — Vierra Magen Marcus LLP

(57) ABSTRACT

A method is provided that includes forming a word line above a substrate, forming a bit line above the substrate, forming a nonvolatile memory material between the word line and the bit line, and forming a memory cell including the nonvolatile memory material at an intersection of the bit line and the word line. The word line is disposed in a first direction, and includes a first word line portion and a second word line portion. The second word line portion of the word line includes a first conductive oxide material. The bit line is disposed in a second direction perpendicular to the first direction. The nonvolatile memory material includes a barrier oxide material layer and a second conductive oxide material layer, with the barrier oxide material layer disposed adjacent the second word line portion of the word line.

20 Claims, 37 Drawing Sheets

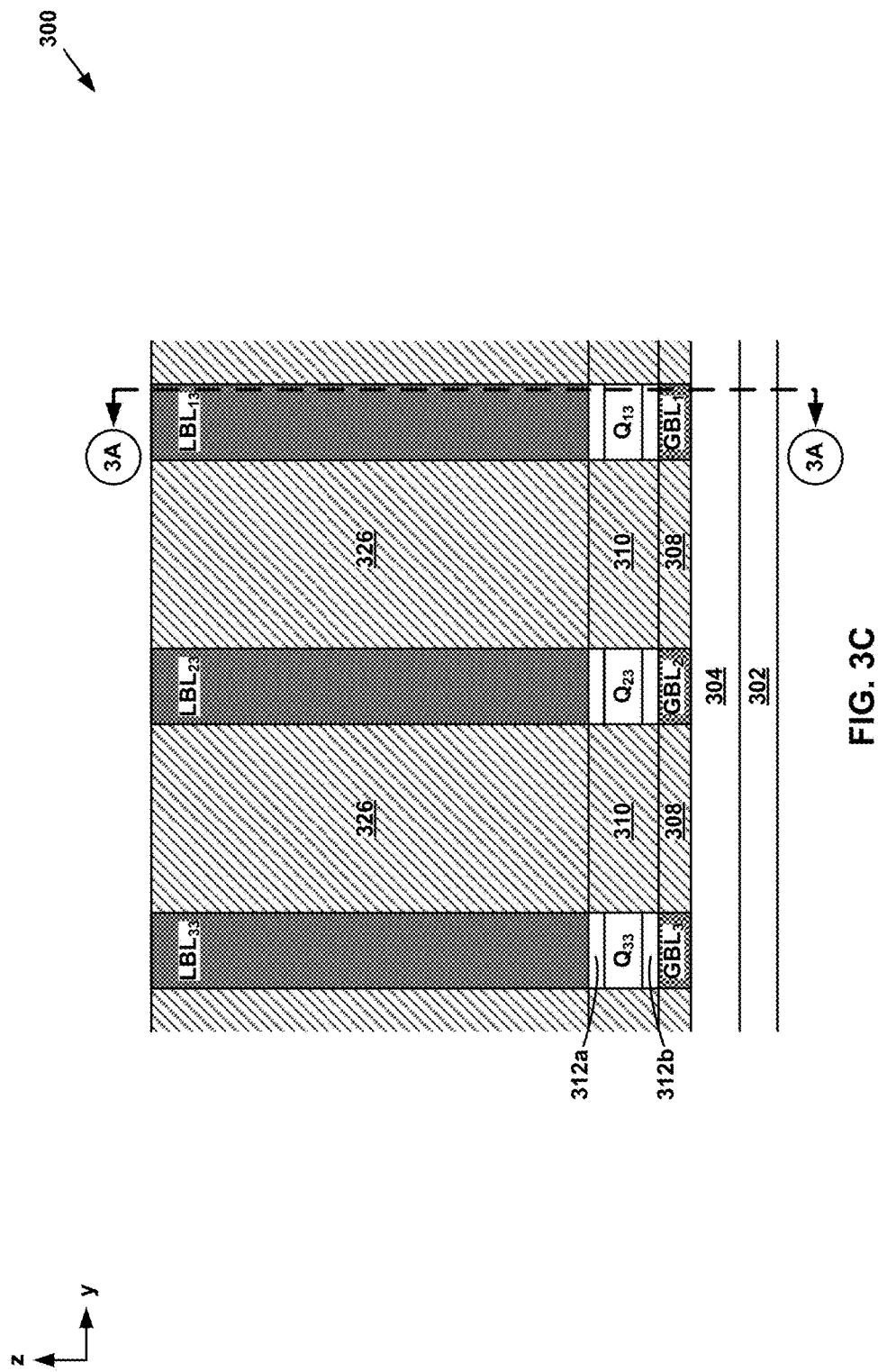

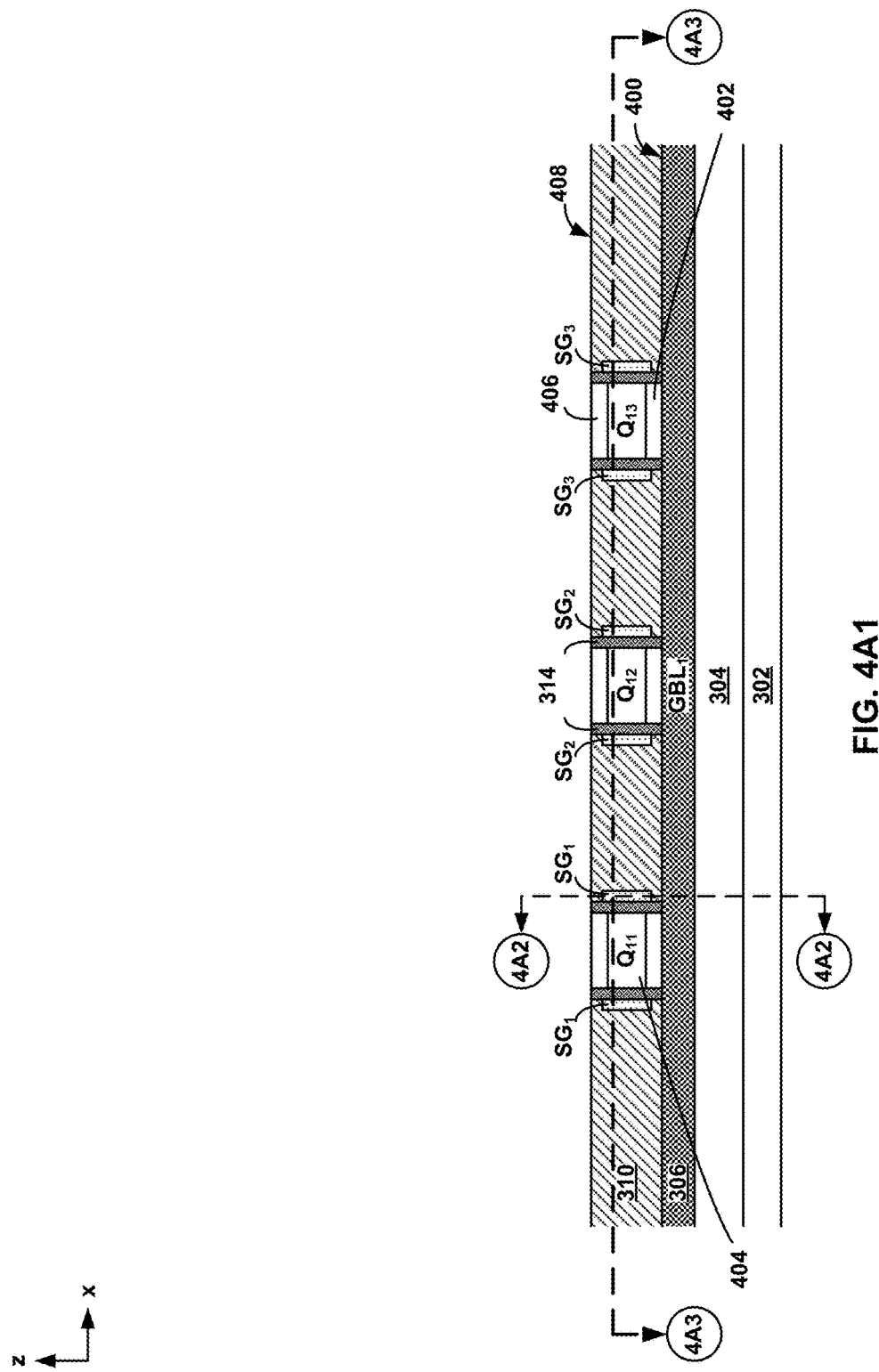
FIG. 4A1

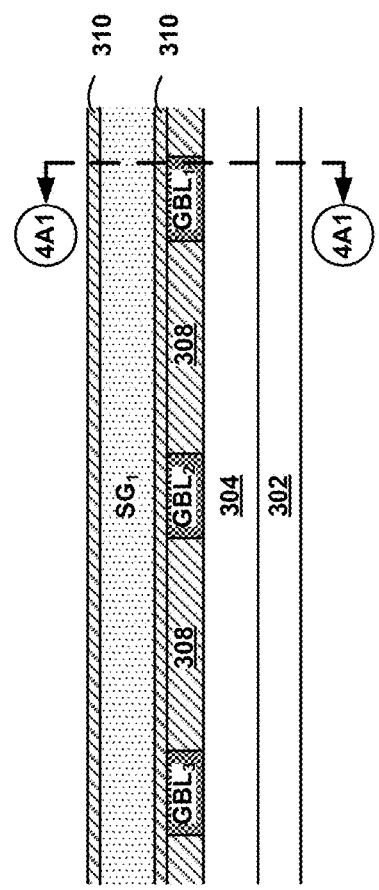
FIG. 4A2

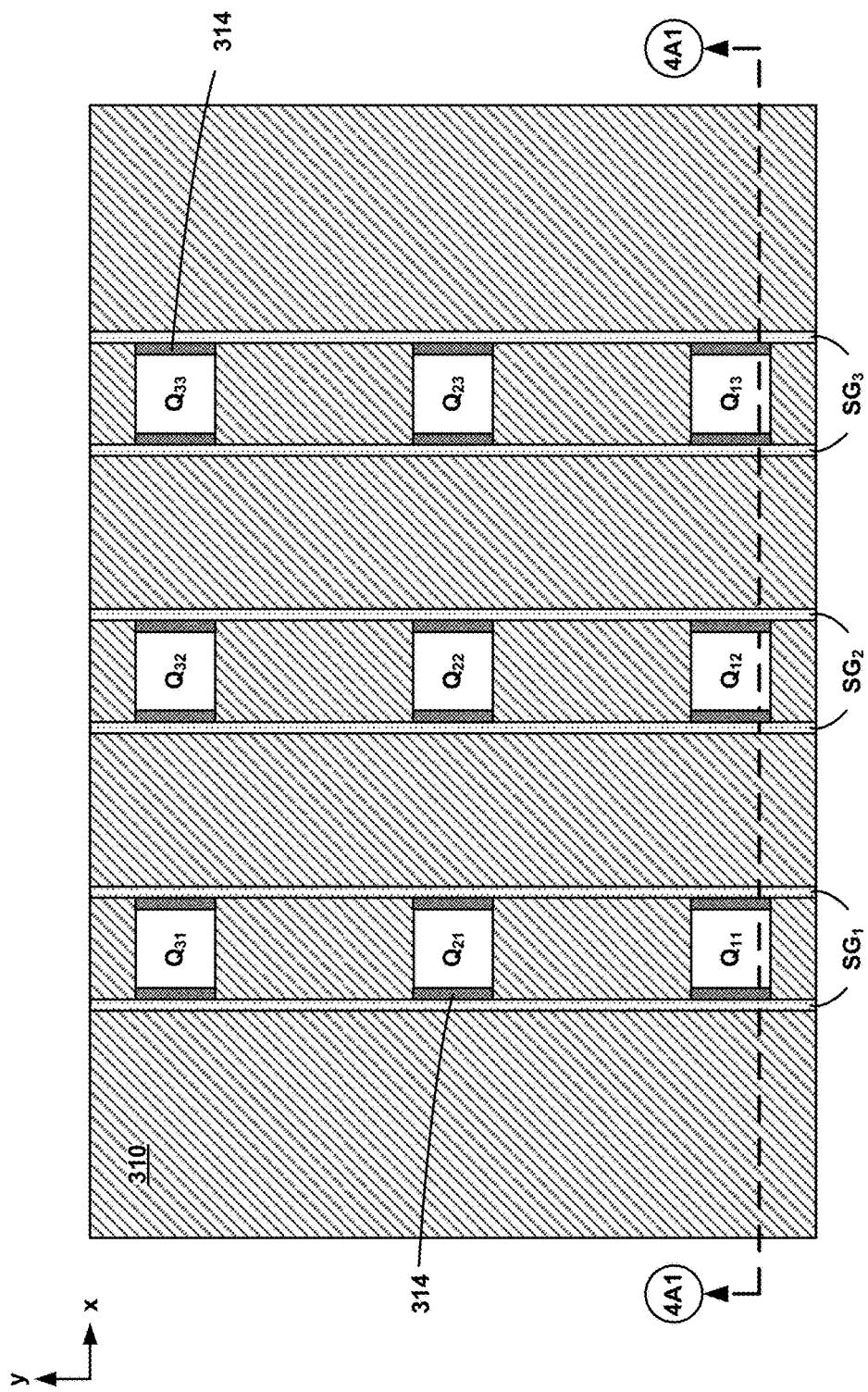

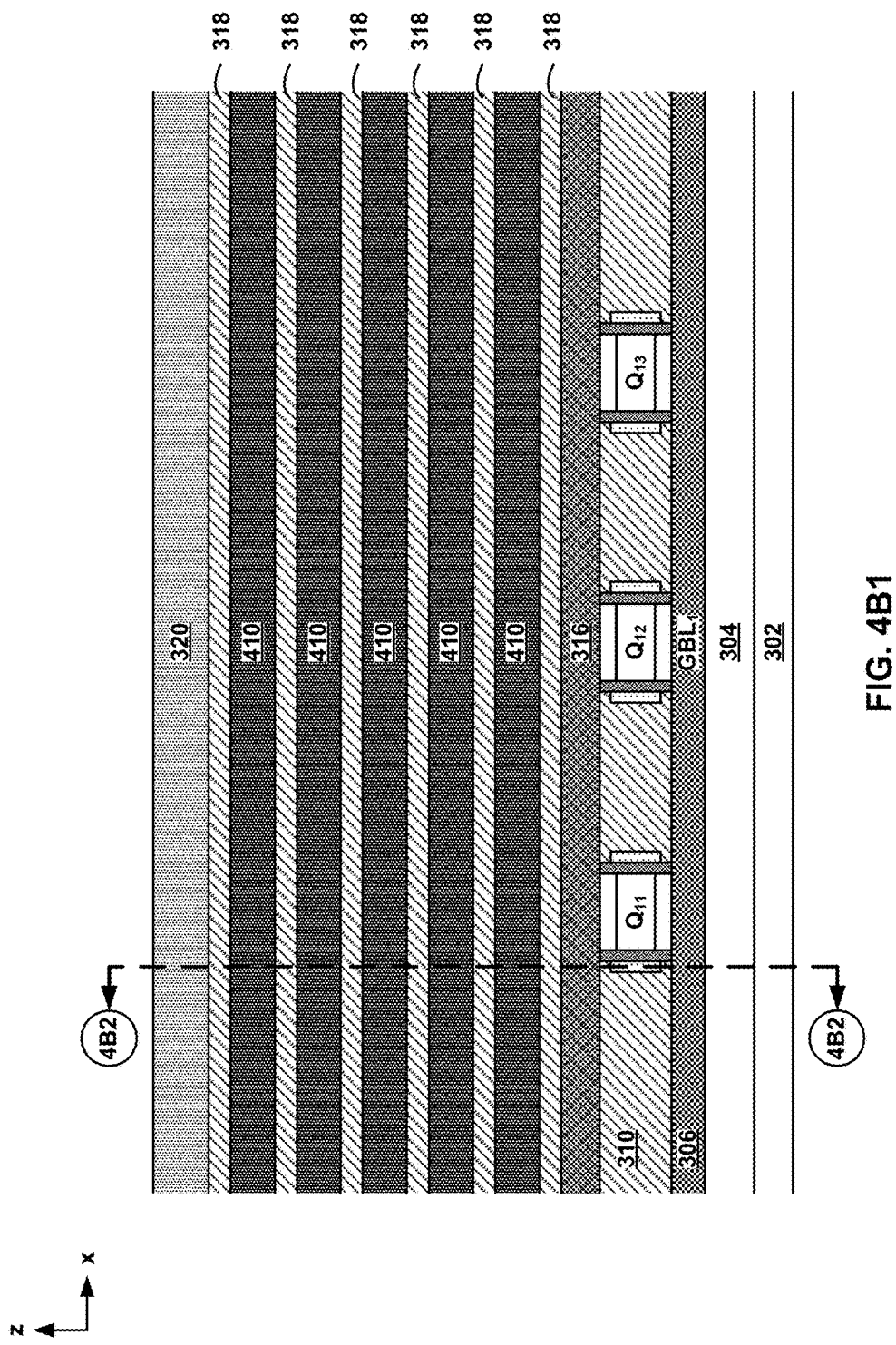
FIG. 4B1

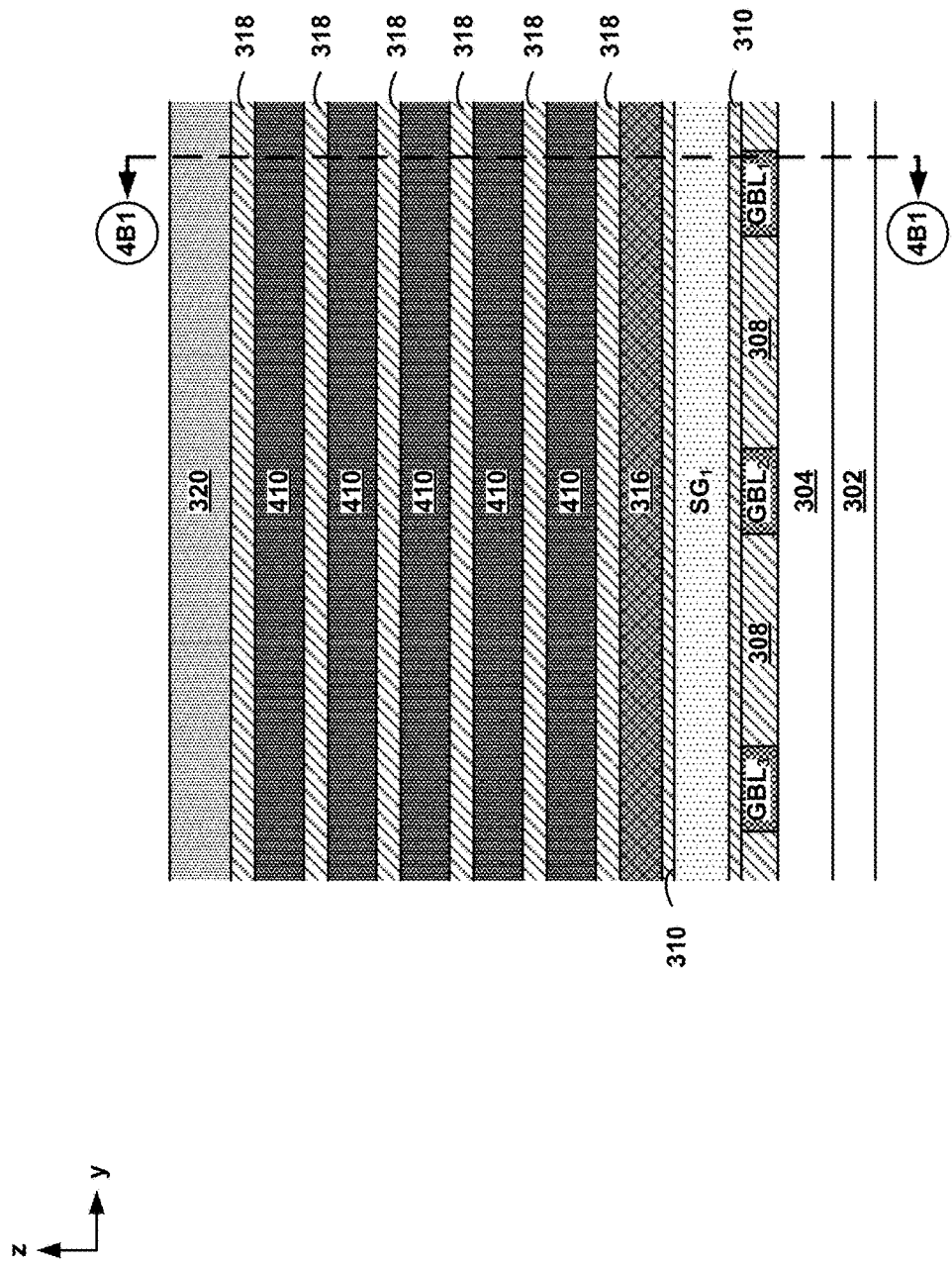
FIG. 4B2

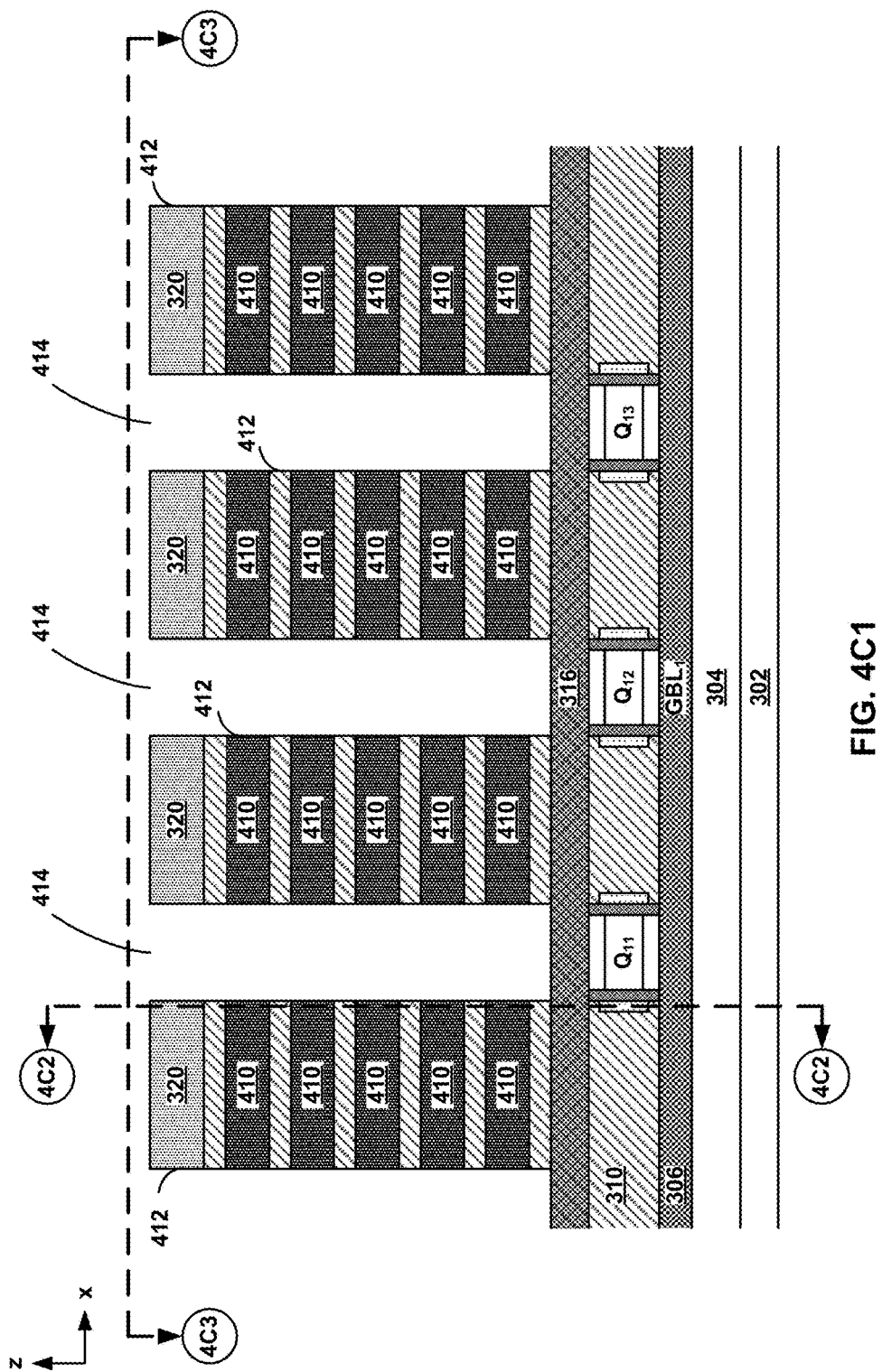
FIG. 4C1

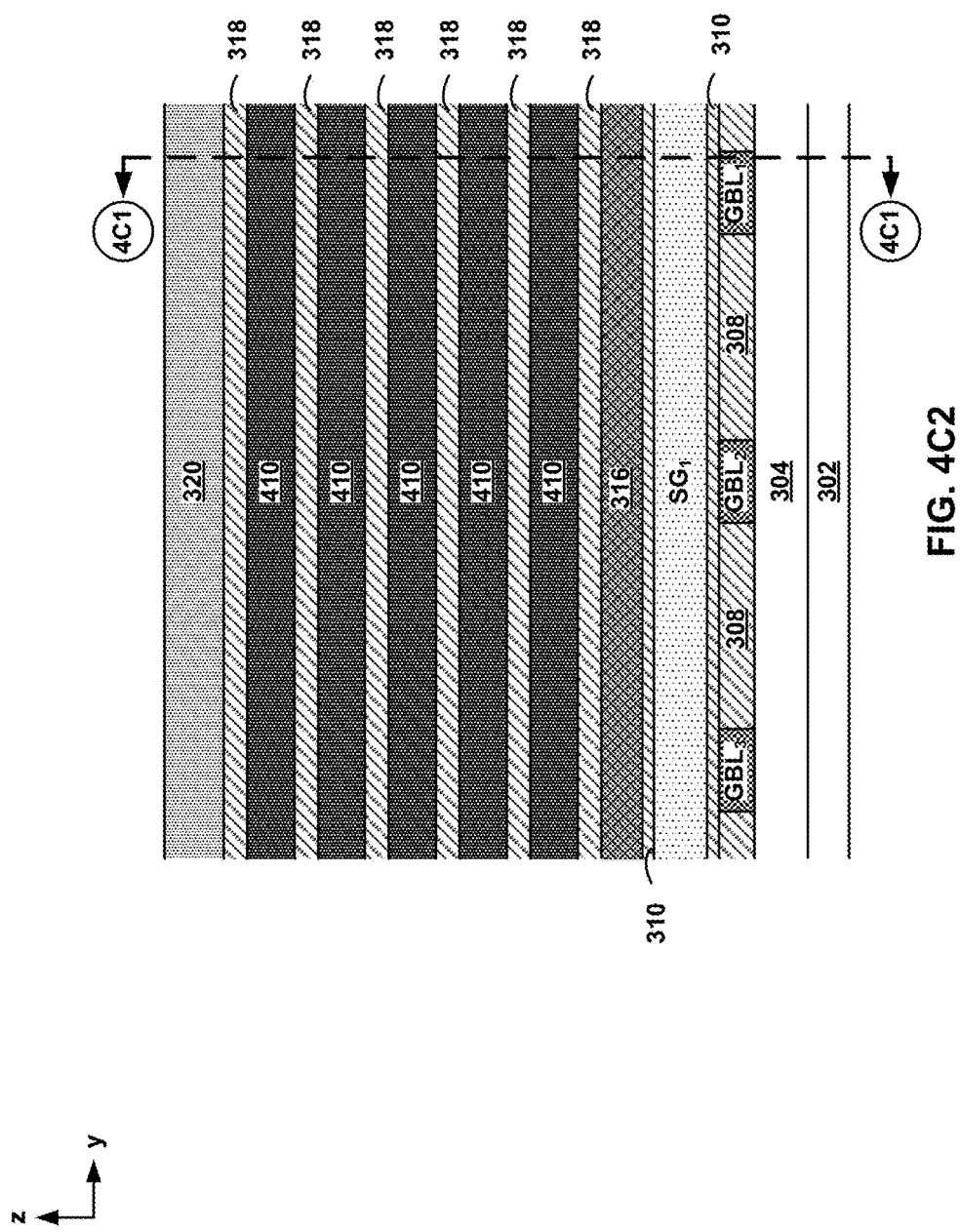
FIG. 4C2

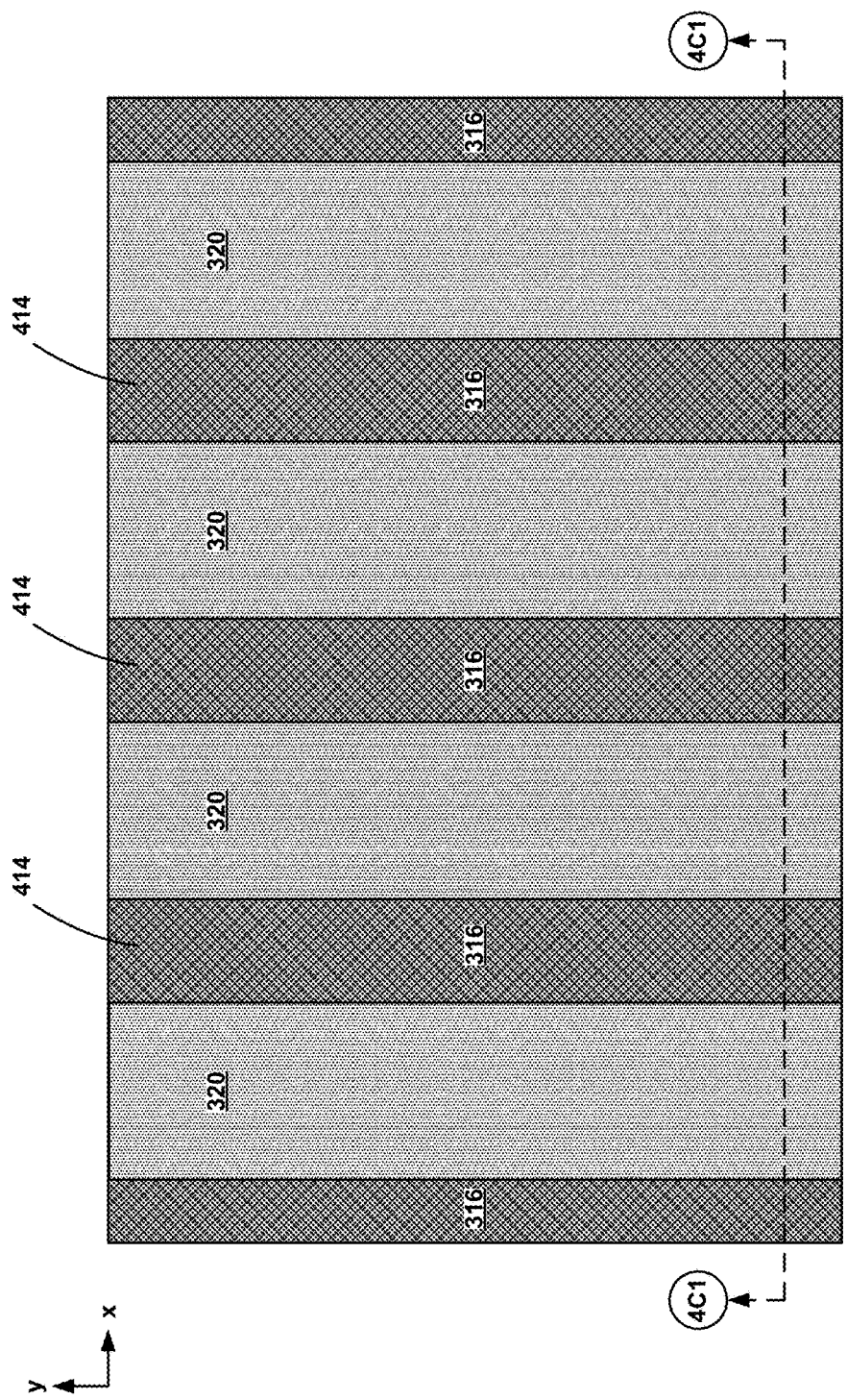
FIG. 4C3

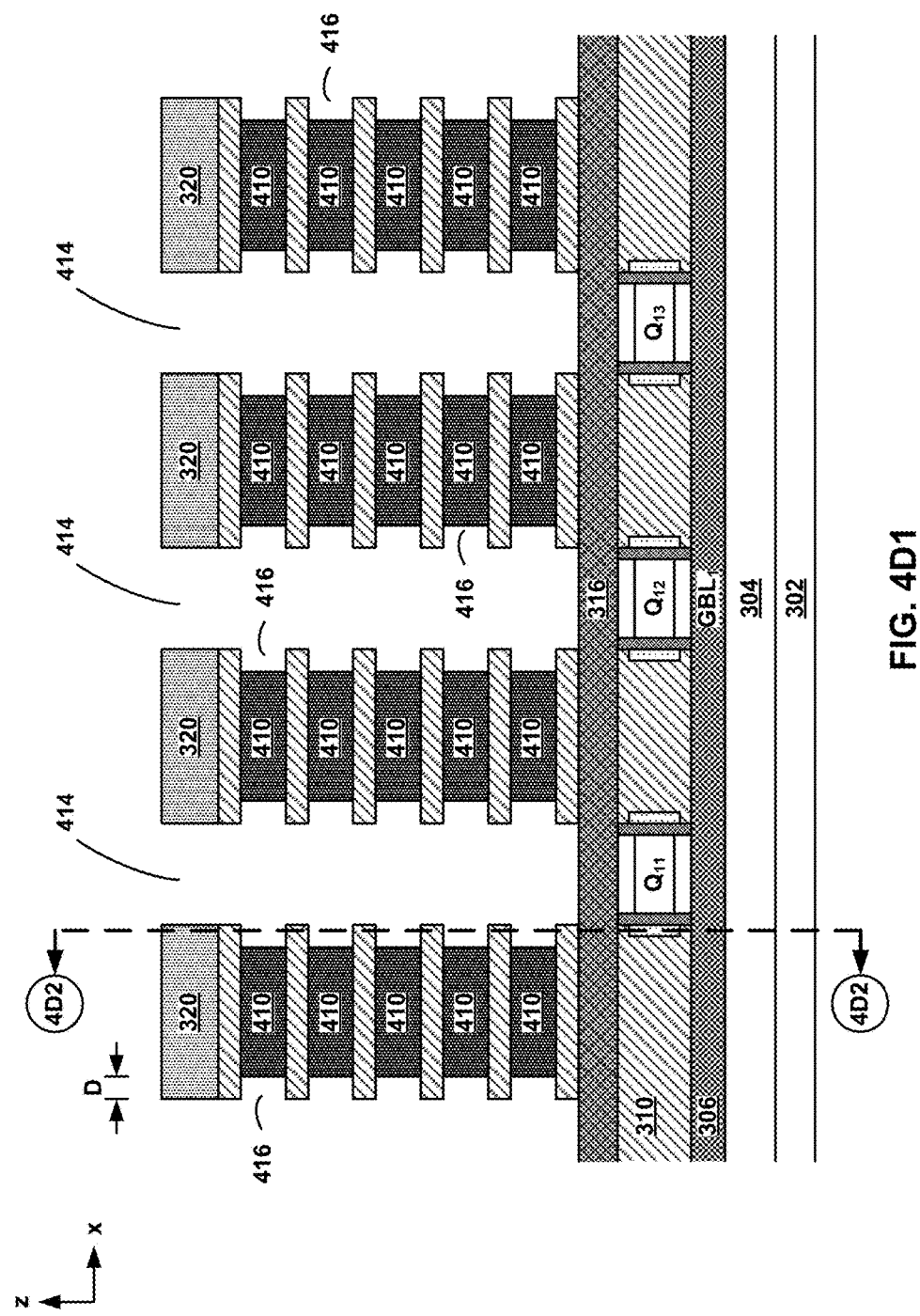
FIG. 4D1

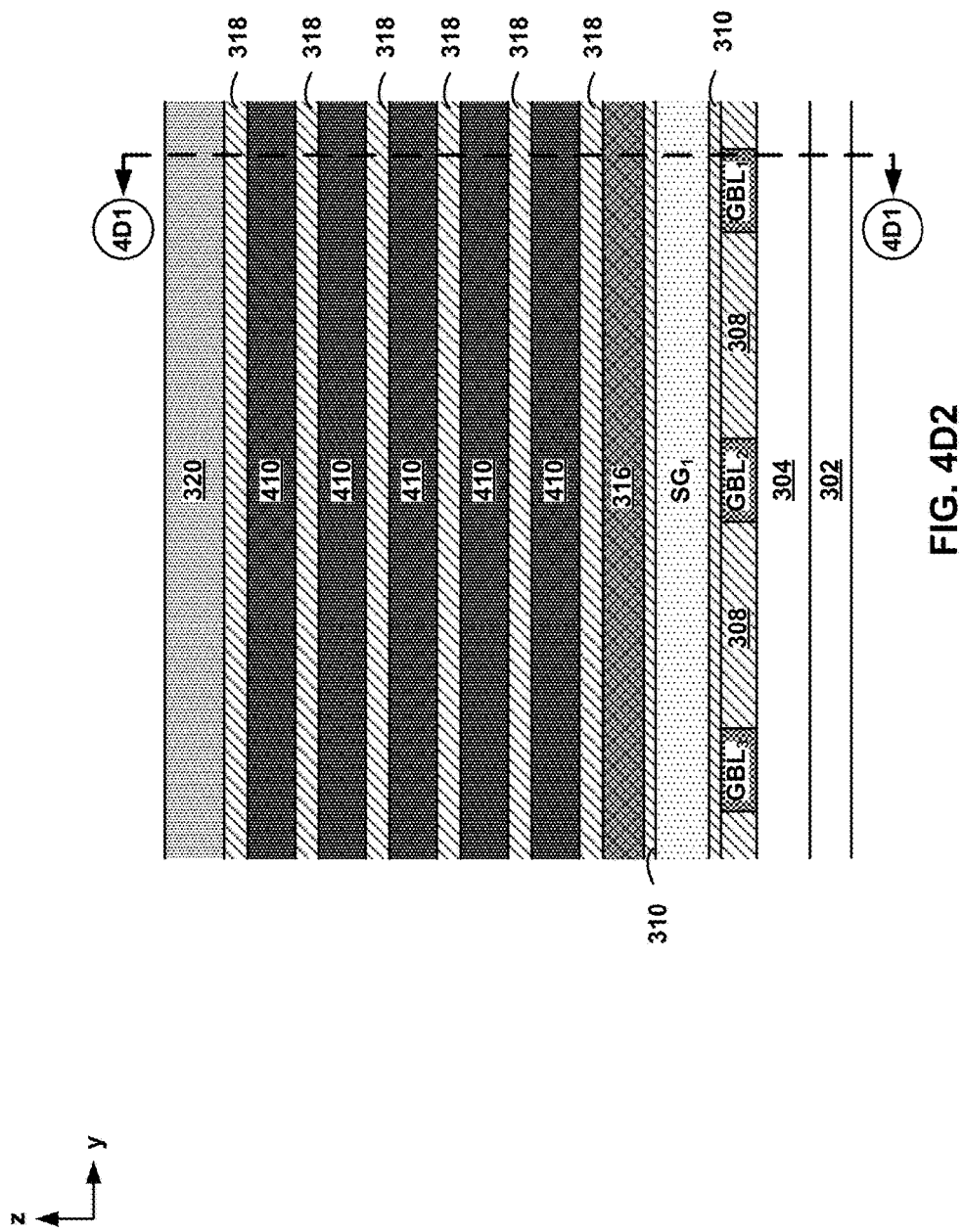
FIG. 4D2

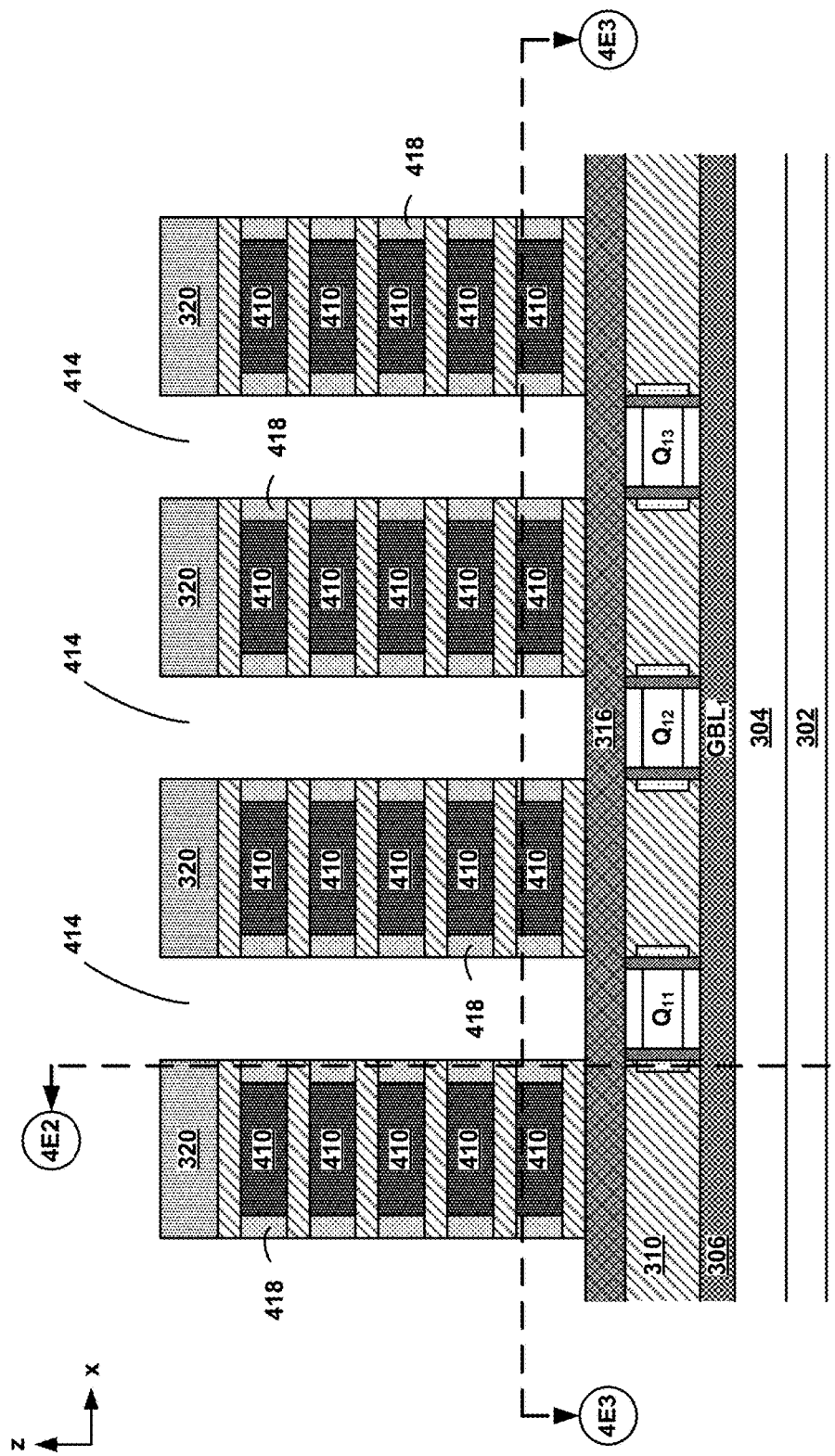
FIG. 4E1

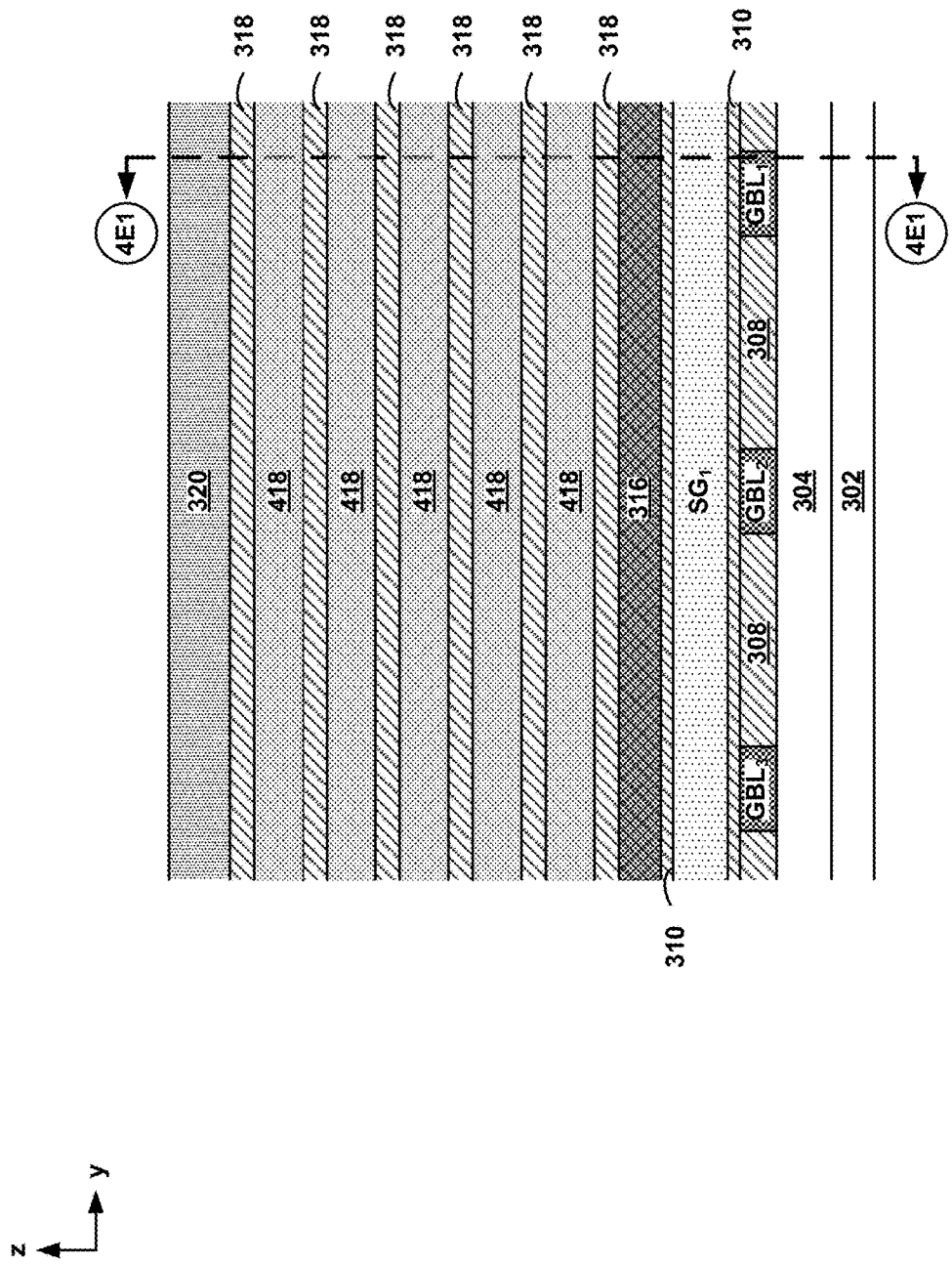
FIG. 4E2

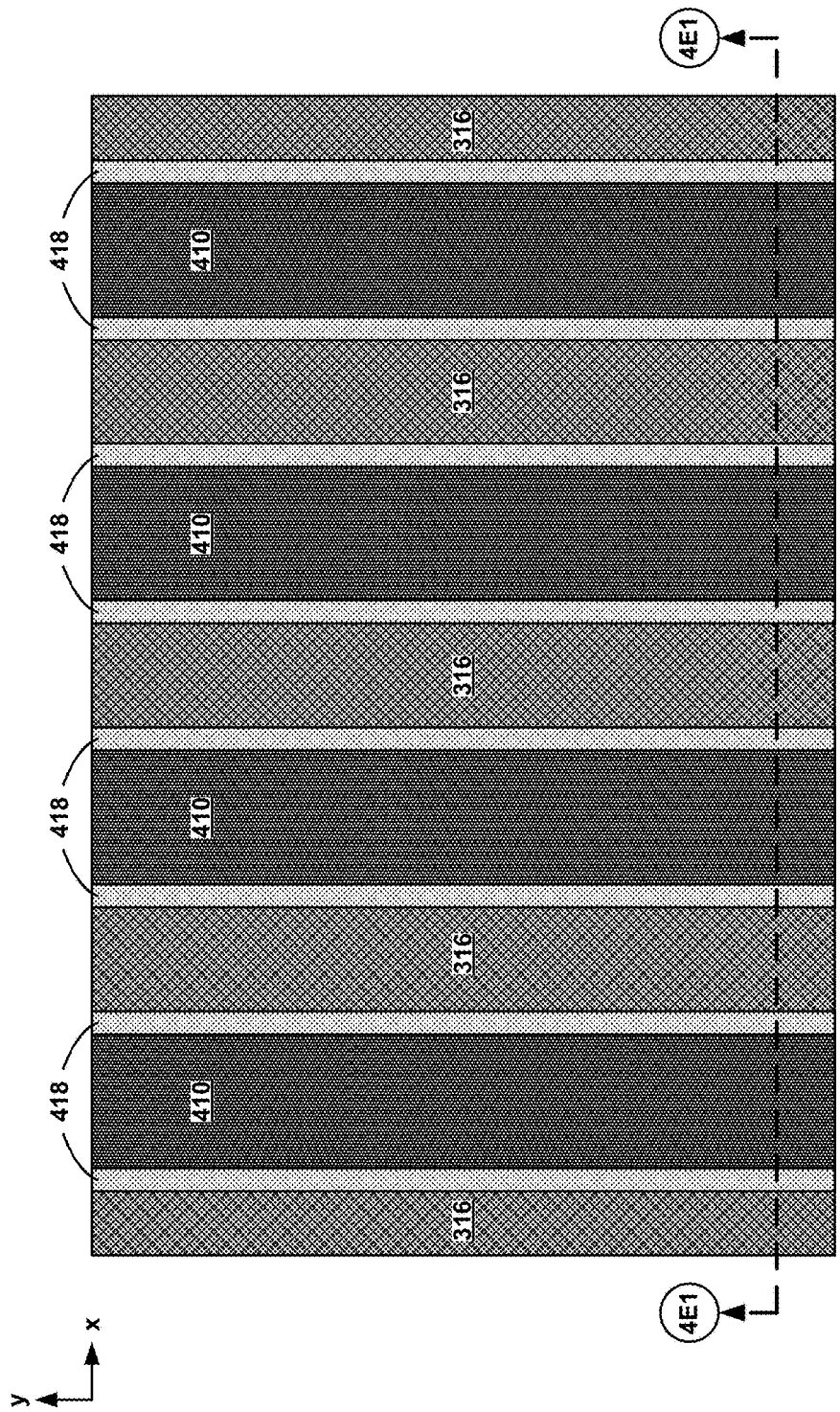
FIG. 4E3

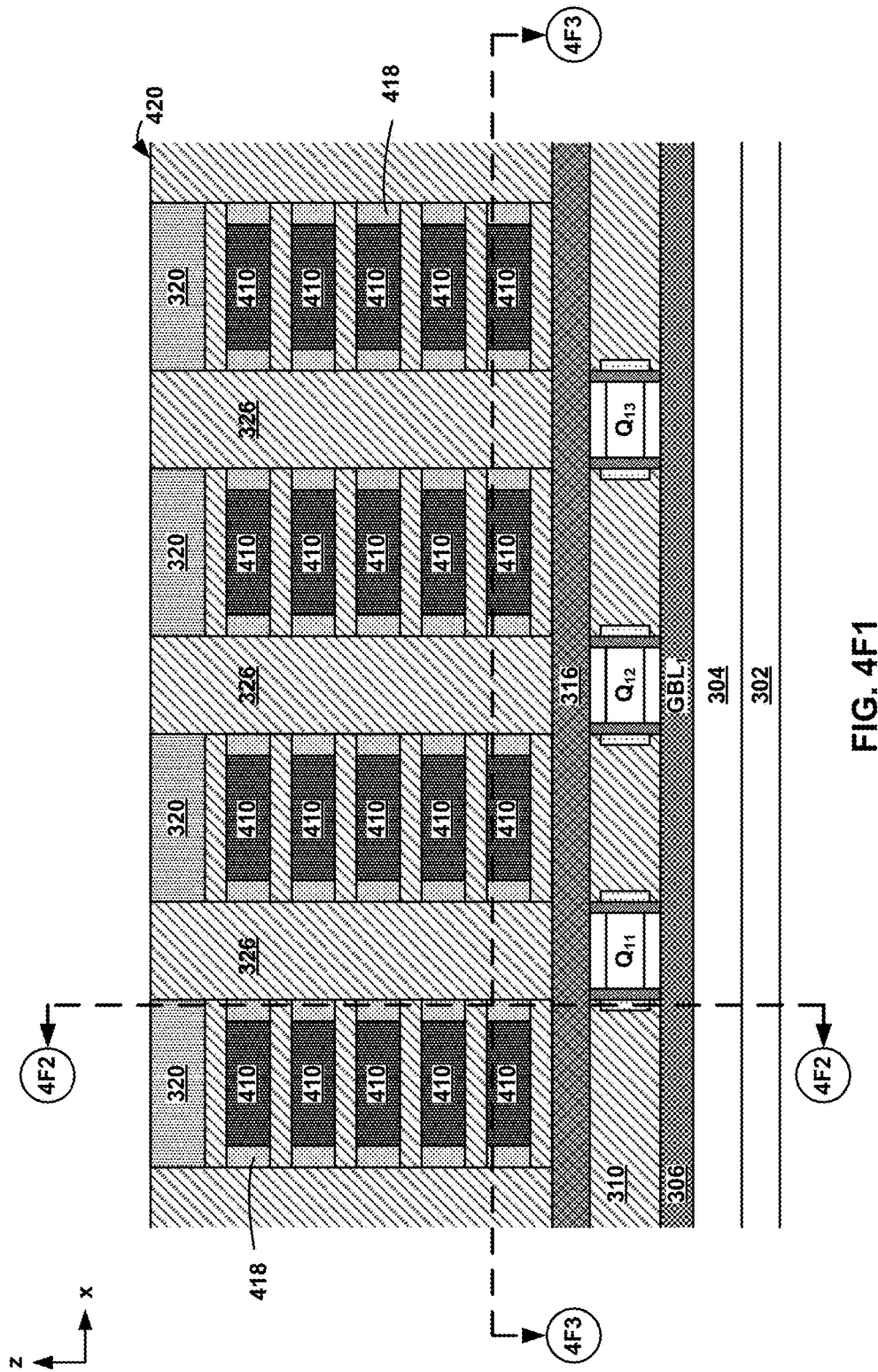
FIG. 4F1

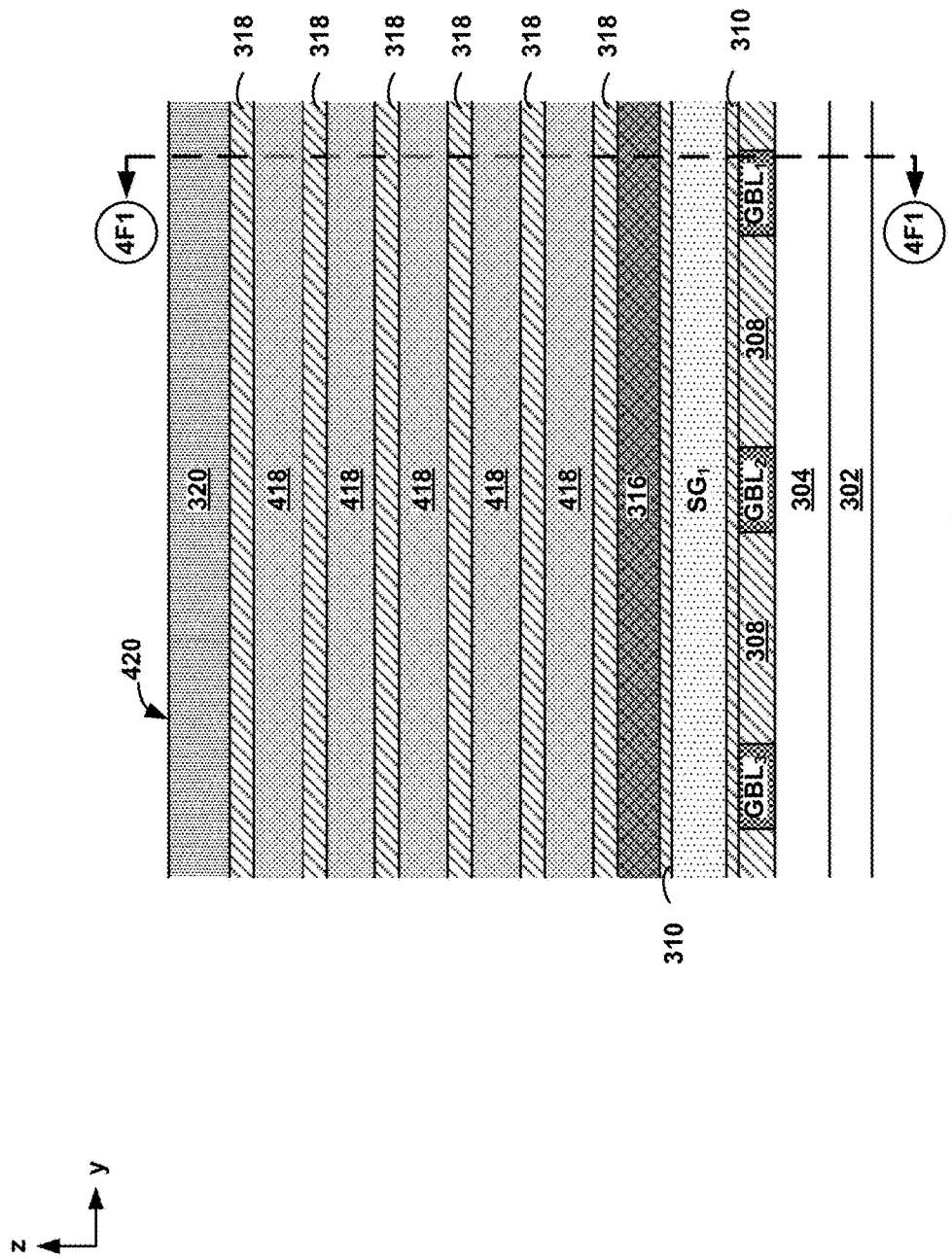
FIG. 4F2

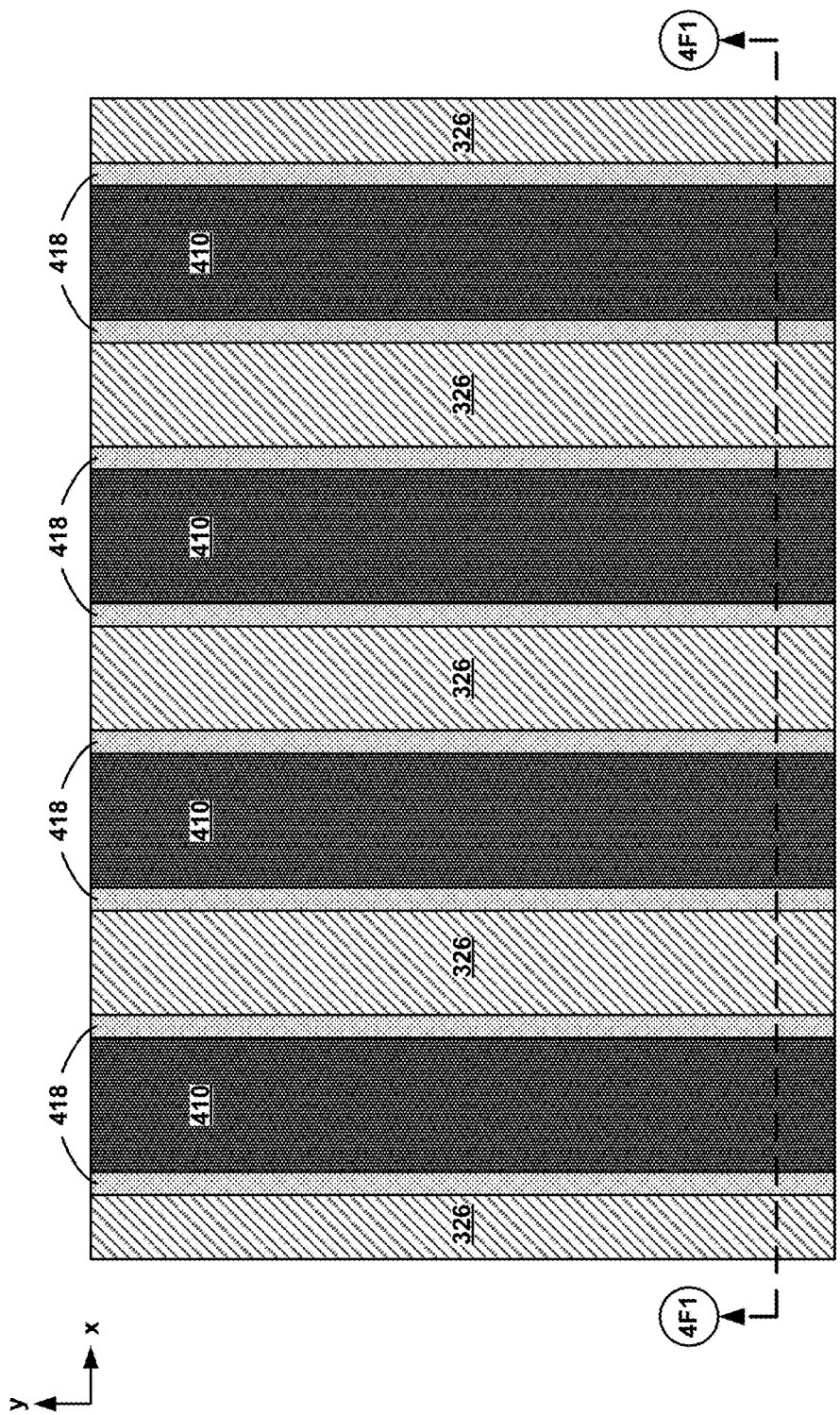
FIG. 4F3

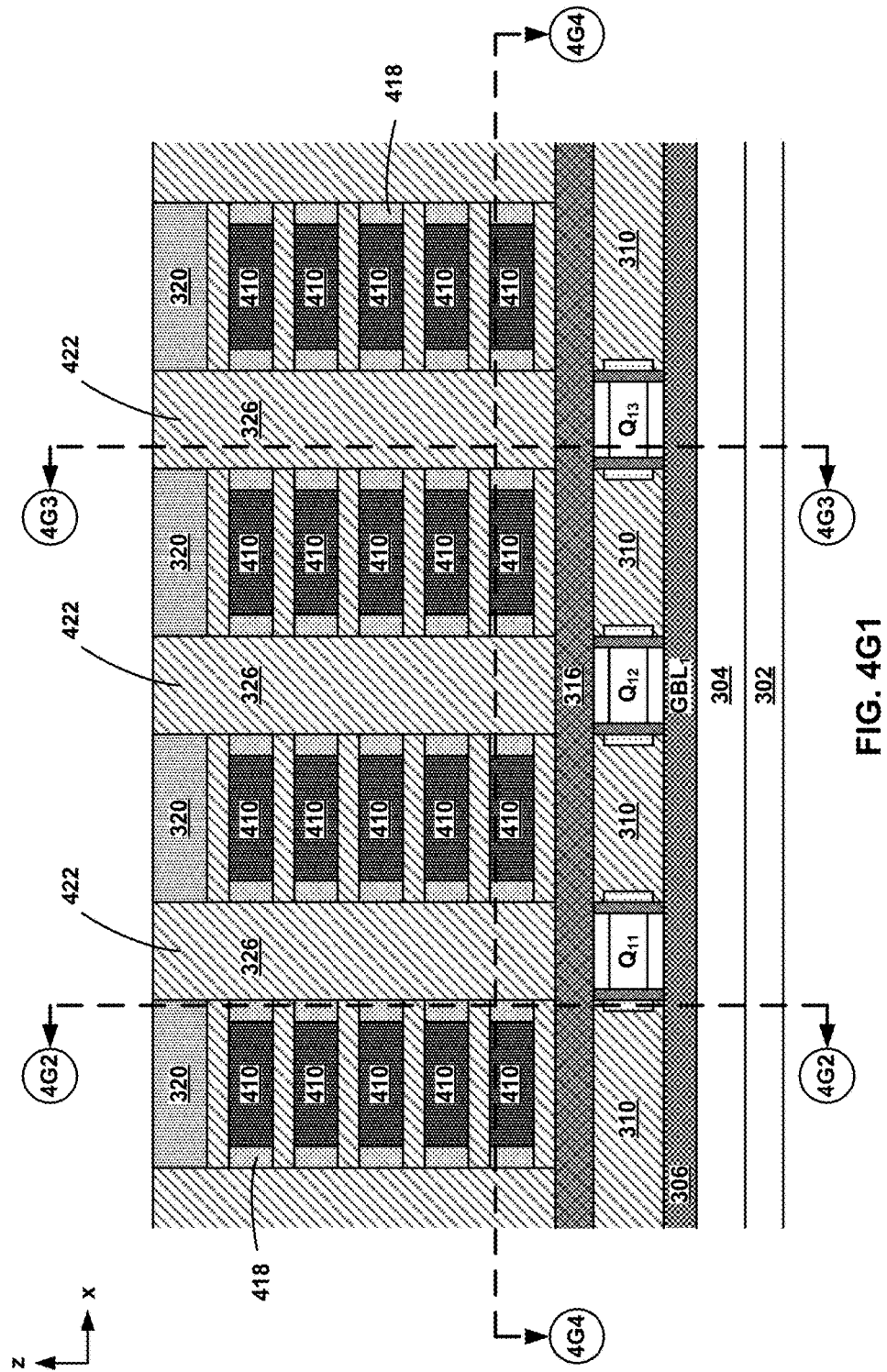
FIG. 4G1

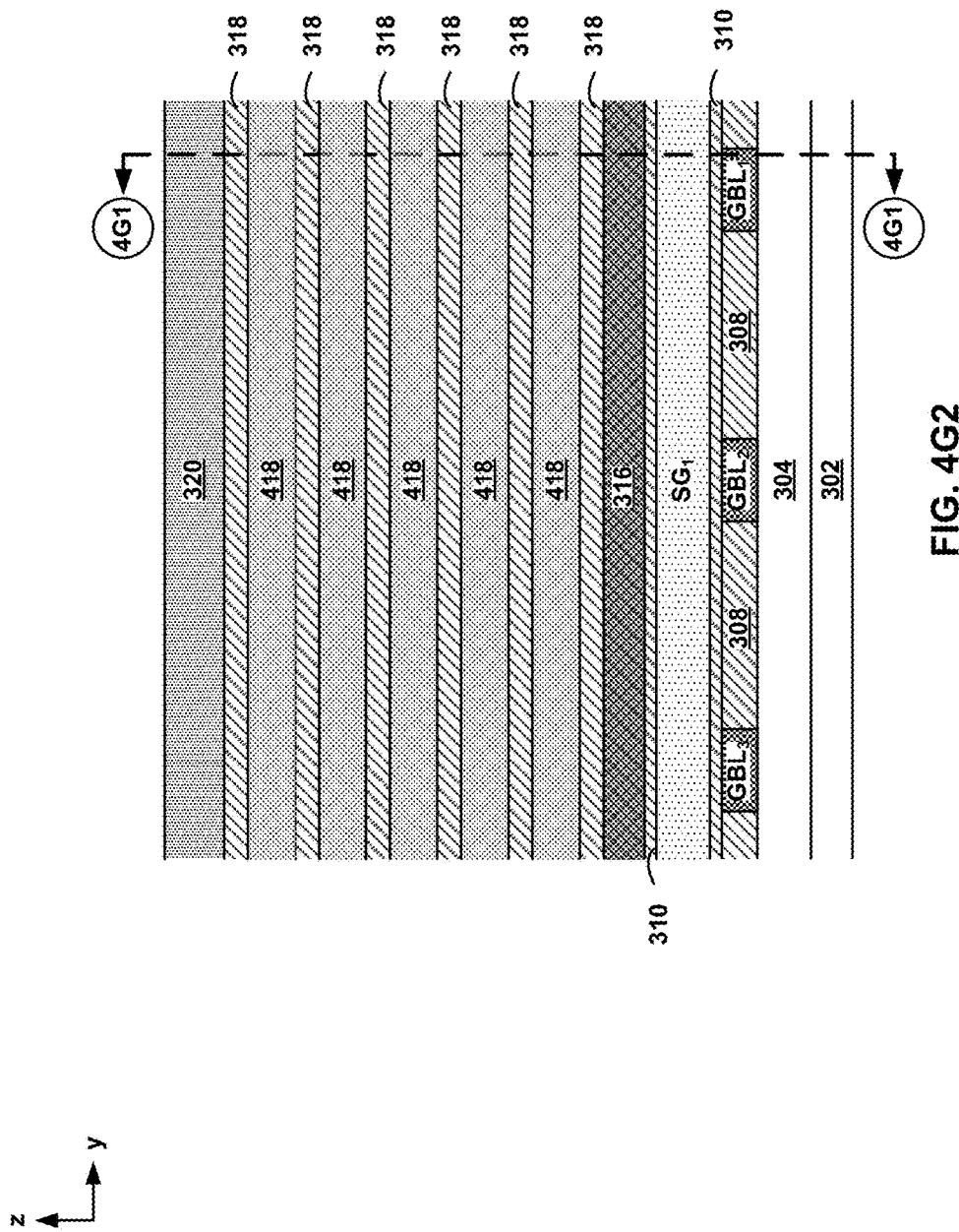
FIG. 4G2

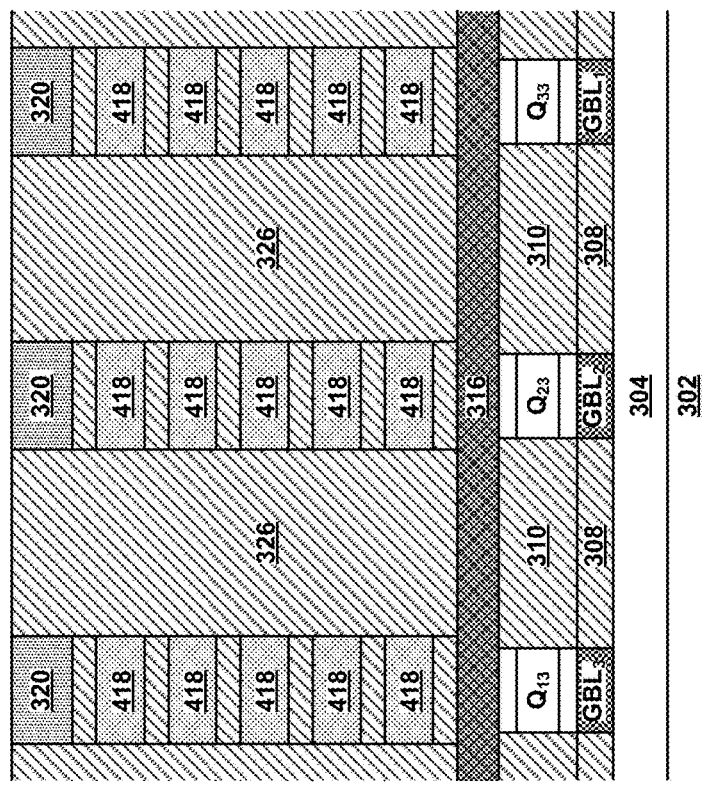
FIG. 4G3

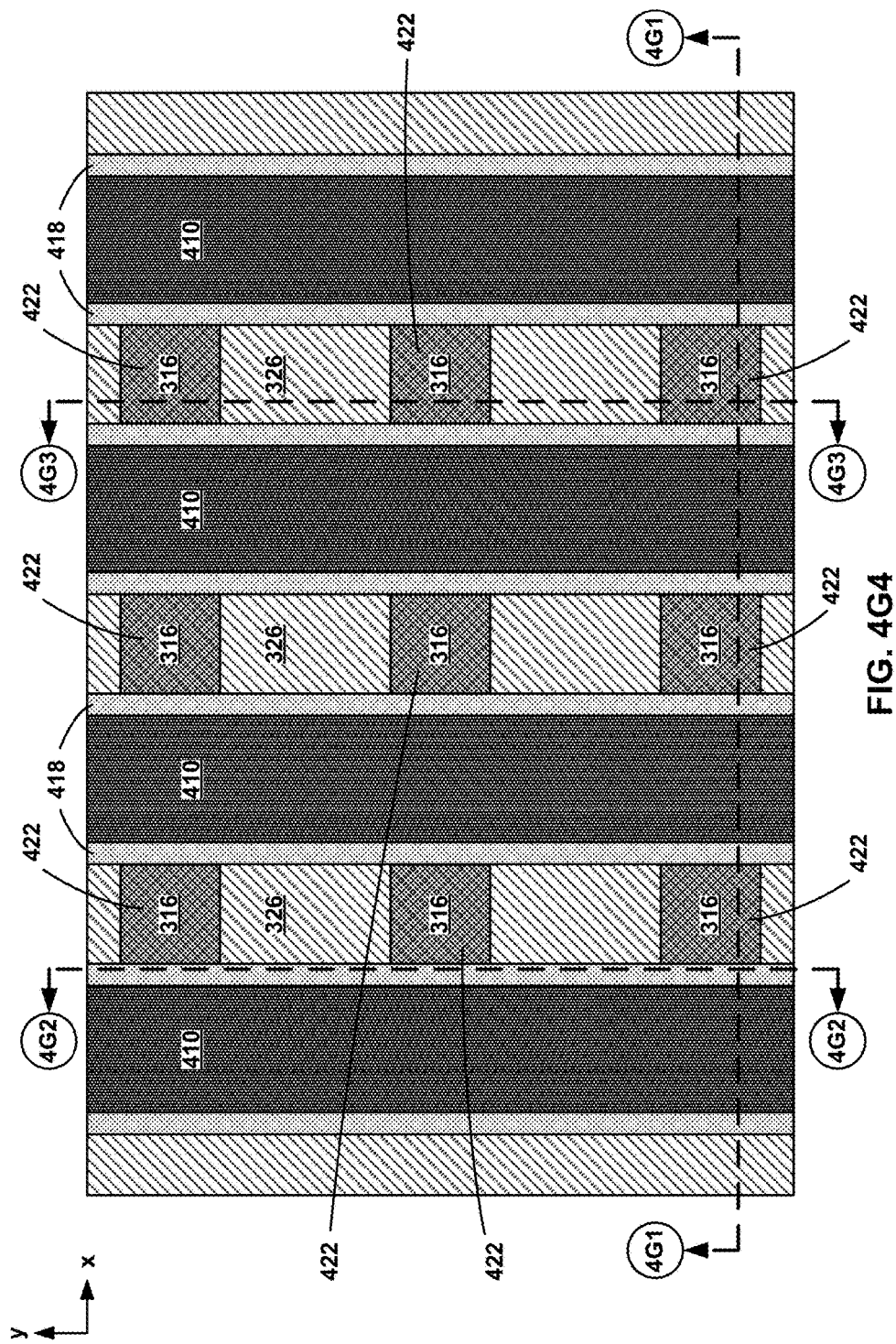
FIG. 4G4

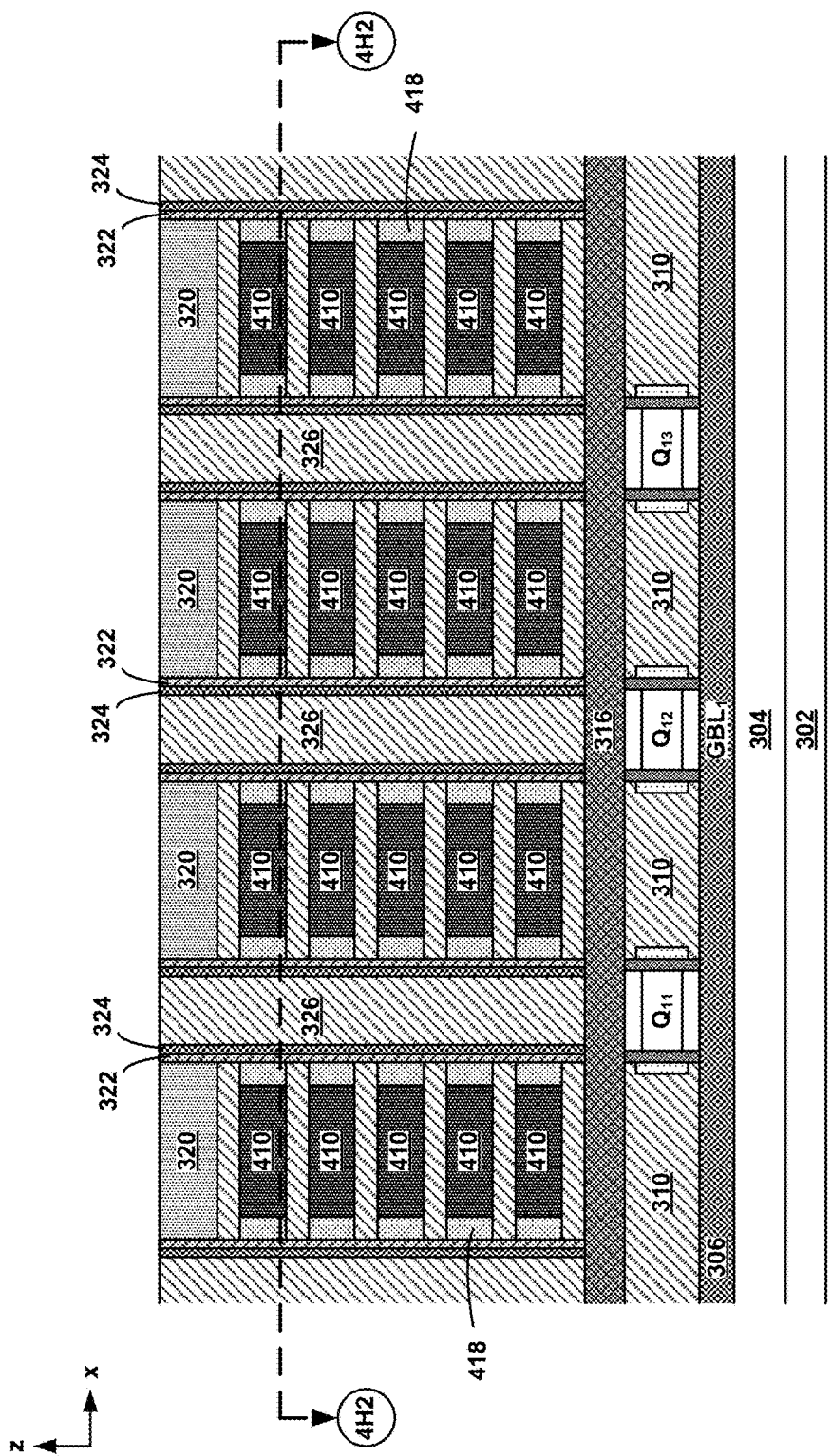
FIG. 4H1

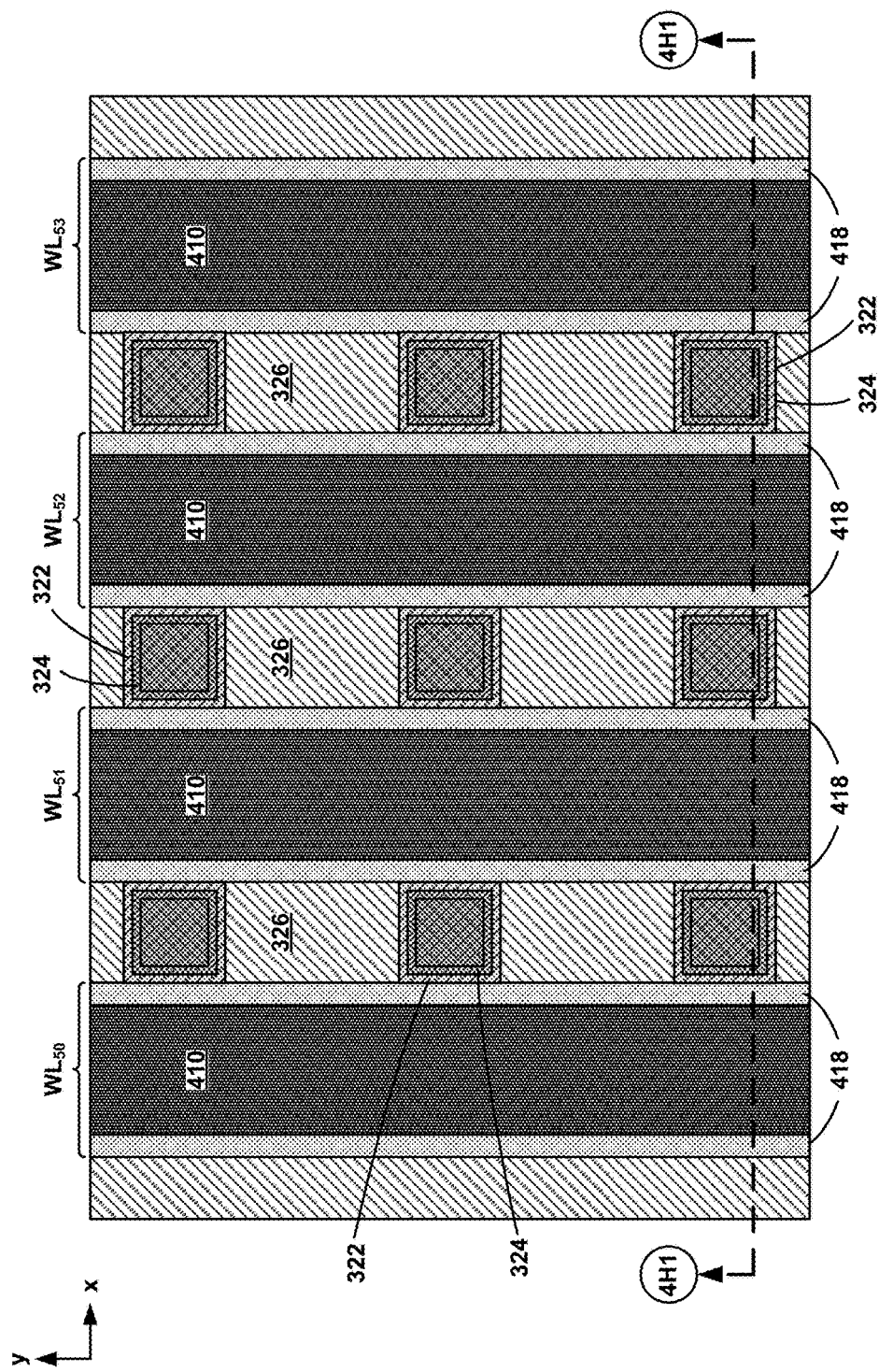
FIG. 4H2

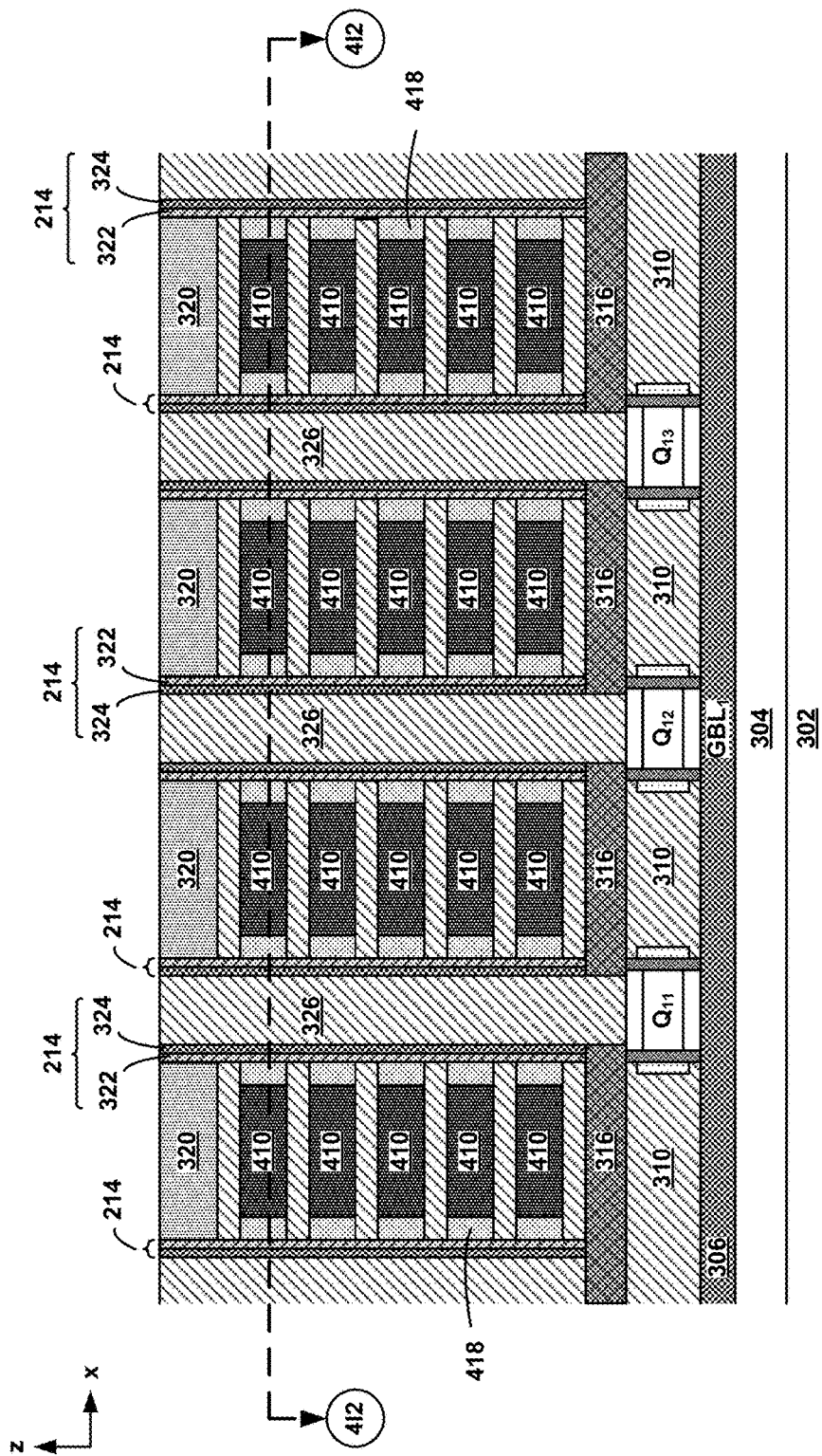
FIG. 4I1

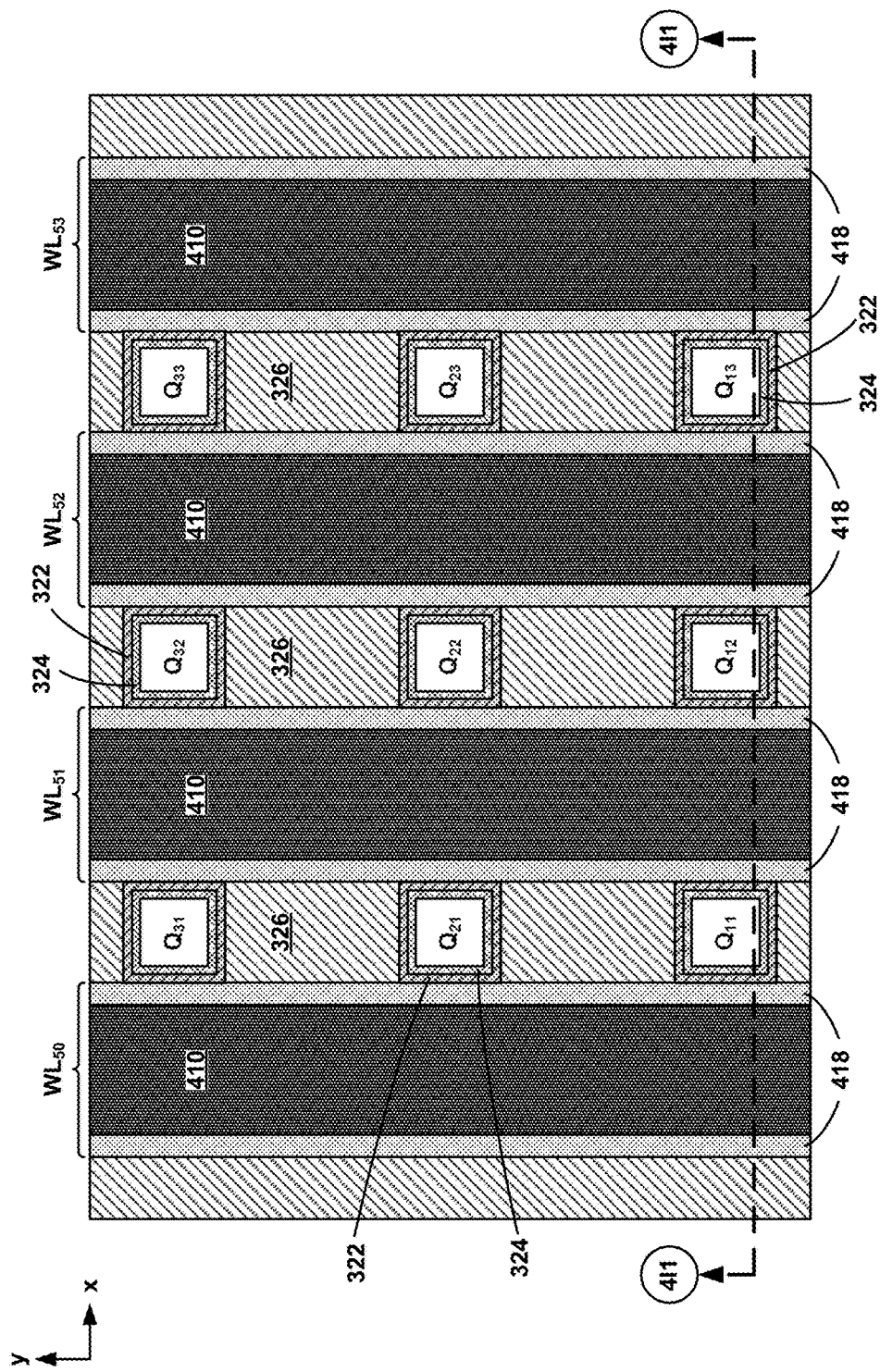
FIG. 4I2

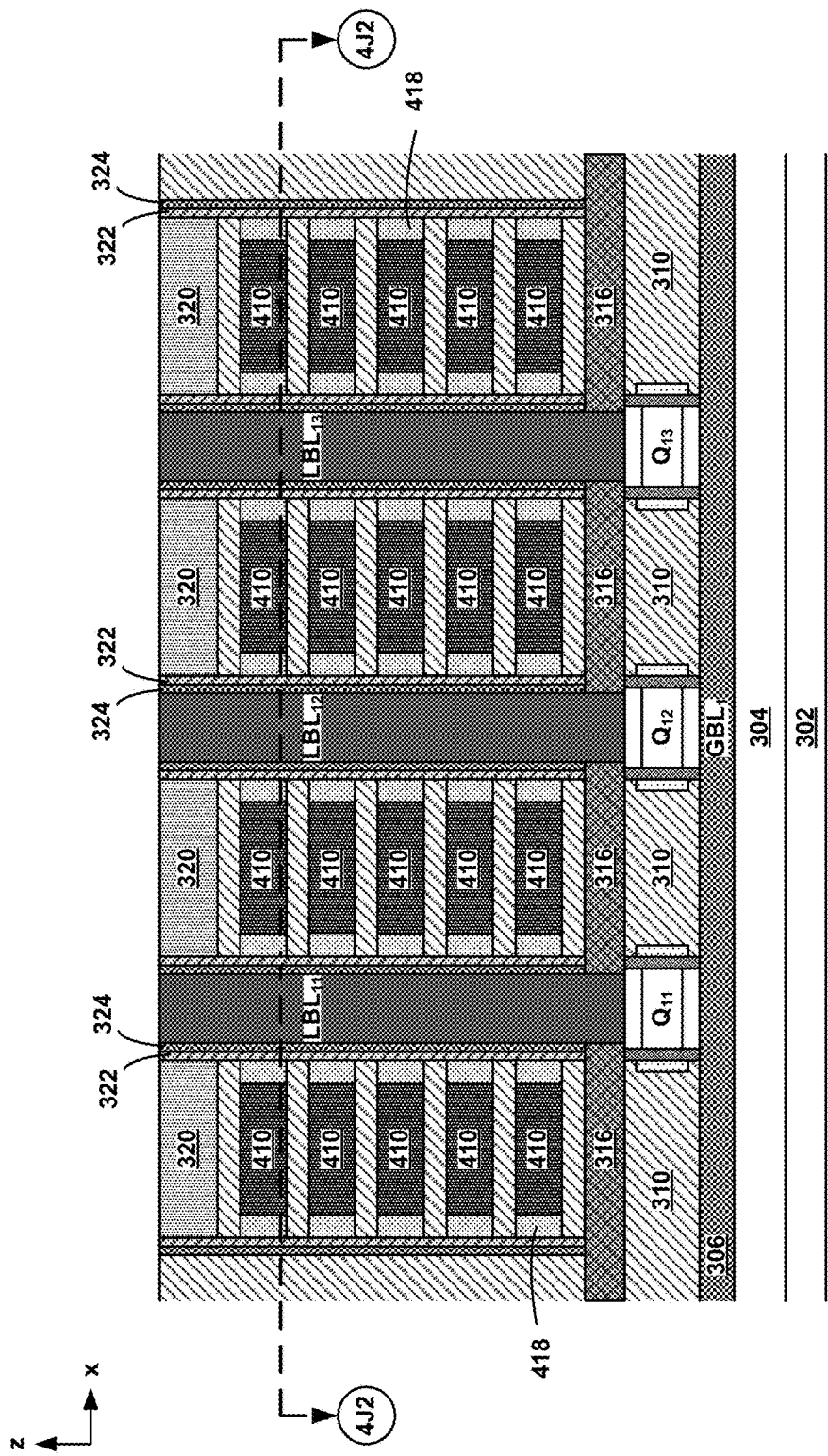
FIG. 4J1

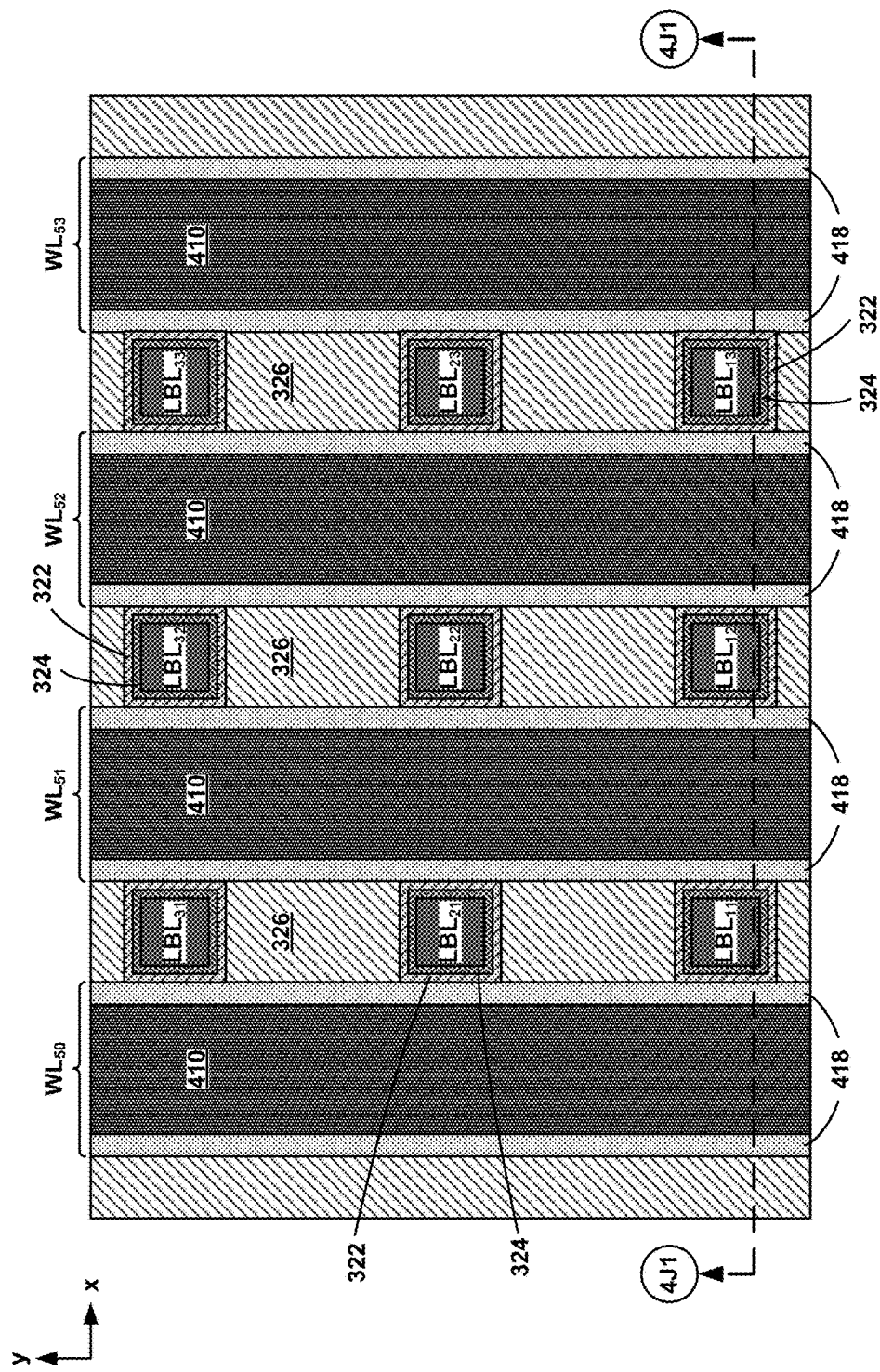
FIG. 4J2

METHODS FOR THREE-DIMENSIONAL NONVOLATILE MEMORY THAT INCLUDE MULTI-PORTION WORD LINES

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses memory cells that include reversible resistance-switching memory elements that may be set to either a low resistance state or a high resistance state. The memory cells may be individually connected between first and second conductors (e.g., a bit line electrode and a word line electrode). The state of such a memory cell is typically changed by proper voltages being placed on the first and second conductors.

In recent years, non-volatile memory devices have been scaled to reduce the cost per bit. However, as process geometries shrink, many design and process challenges are presented

BRIEF DESCRIPTION OF THE DRAWINGS

FIGS. 3A-3E depict various views of an embodiment monolithic three-dimensional memory array.
FIGS. 4A1-4J2 are cross-sectional views of a portion of a substrate during an example fabrication of the monolithic three-dimensional memory array of FIGS. 3A-3E.

DETAILED DESCRIPTION

Figure 1A:
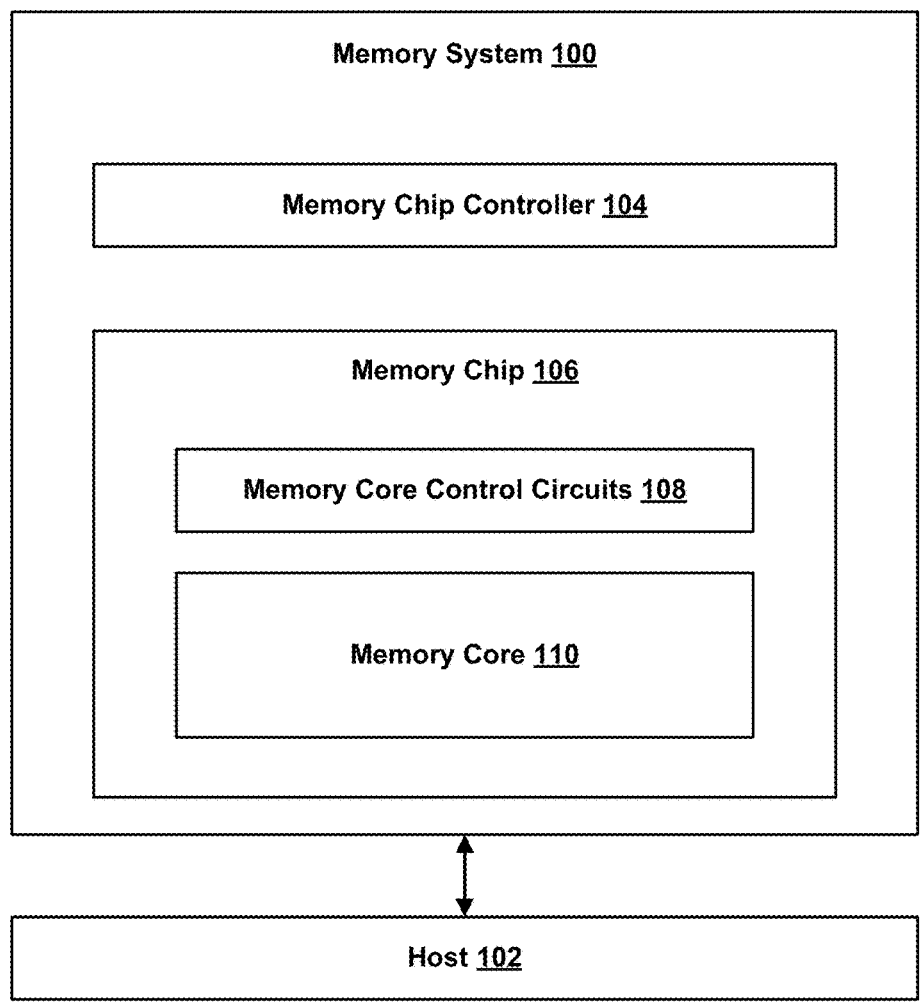
FIG. 1A depicts an embodiment of a memory system and a host.

Technology is described for forming monolithic three-dimensional nonvolatile memory arrays. In particular, technology is described for forming monolithic three-dimensional nonvolatile memory arrays that include reversible resistance-switching memory cells that have resistance-switching elements, each disposed between a word line and a bit line. The word line includes a first word line portion and a second word line portion, and the second word line portion includes a first conductive oxide material. Each reversible resistance-switching element includes a barrier oxide material layer and a second conductive oxide material layer. In an embodiment, each barrier oxide material layer is disposed adjacent a corresponding second word line portion. In an embodiment, each reversible resistance-switching element does not include a semiconductor material layer (e.g., amorphous silicon or other semiconductor material layer).

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible resistance-switching memory element disposed between first and second conductors. Example reversible resistance-switching memory elements include a phase change material, a ferroelectric material, a metal oxide (e.g., hafnium oxide), a barrier modulated switching structure, or other similar reversible resistance-switching memory elements.

Example barrier modulated switching structures include a semiconductor material layer (e.g., an amorphous silicon layer) adjacent a conductive oxide material layer (e.g., a titanium oxide layer). Other example barrier modulated switching structures include a thin (e.g., less than about 2 nm) barrier oxide material (e.g., an aluminum oxide layer) disposed between a semiconductor material layer (e.g., an amorphous silicon layer) and a conductive oxide material layer (e.g., a titanium oxide layer). Still other example barrier modulated switching structures include a barrier oxide material (e.g., an aluminum oxide layer) disposed adjacent a conductive oxide material layer (e.g., a titanium oxide layer), with no semiconductor material layer (e.g., amorphous silicon) in the barrier modulated switching structure. As used herein, a memory cell that includes a barrier modulated switching structure is referred to herein as a "barrier modulated cell" (BMC).

In some embodiments, each memory cell in a cross-point memory array includes a reversible resistance-switching memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
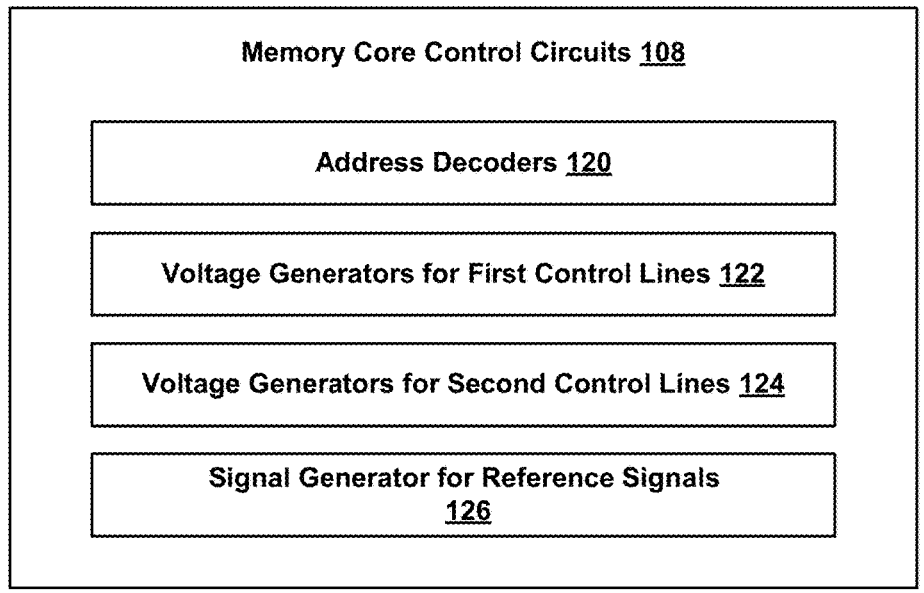
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected) word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
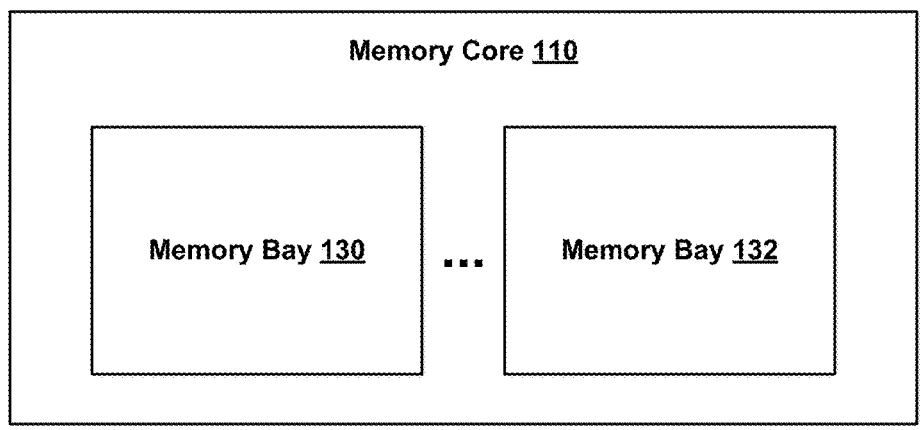
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
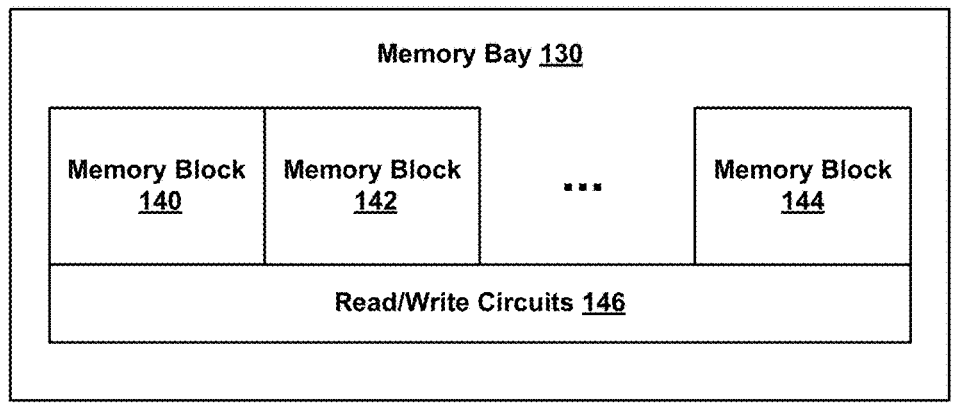
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more programming pulses followed by a memory cell verification phase may be used to program the particular memory cell to be in the correct state.

Figure 1E:
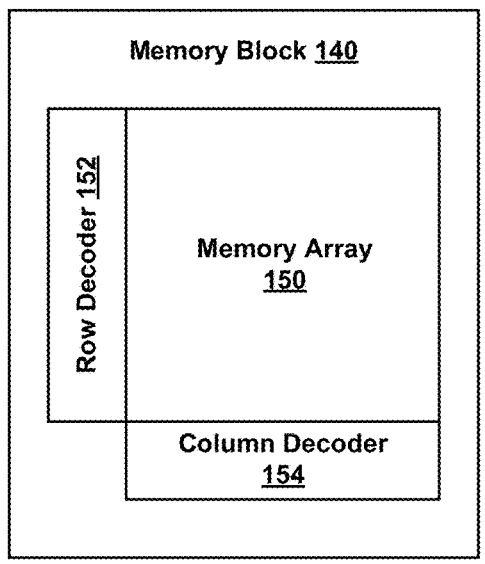
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
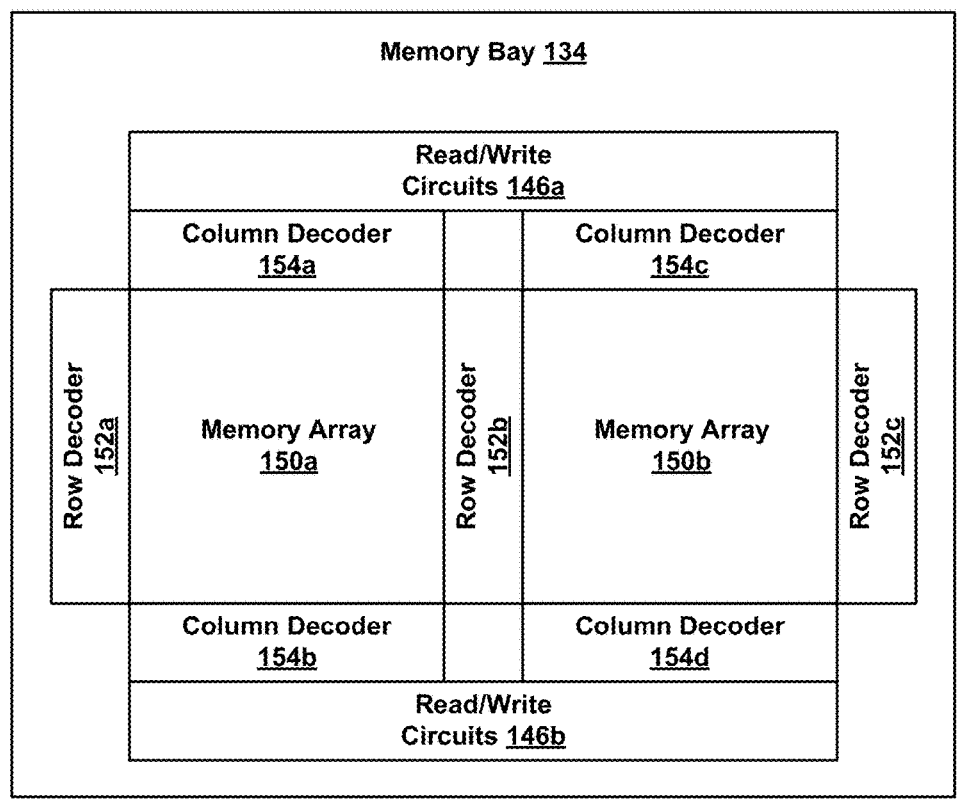
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
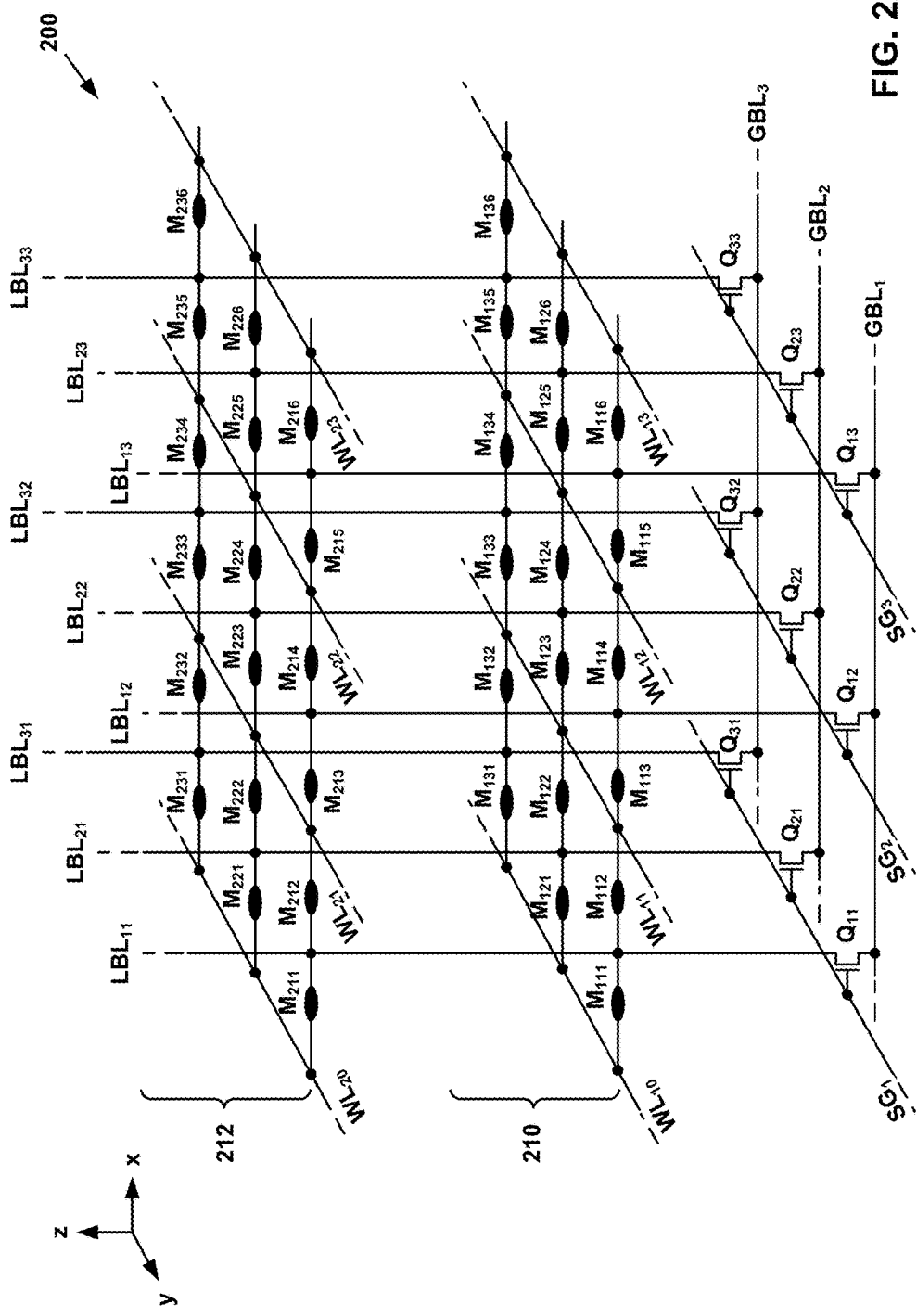
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{11}$, respectively, and may be used to connect local bit lines $LBL_{11}$-$LBL_{11}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be selectively applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{11}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In an embodiment, a vertical bit line memory array, such as memory array 200, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In an embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line (e.g., $LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

During the write operation described above, the word line (e.g., $WL_{20}$) connected to the selected memory cell ($M_{221}$) may be referred to as a "selected word line," and the local bit line (e.g., $LBL_{21}$) coupled to the selected memory cell ($M_{221}$) may be referred to as the "selected local bit line." All other word lines coupled to unselected memory cells may be referred to as "unselected word lines," and all other local bit lines coupled to unselected memory cells may be referred to as "unselected local bit lines." For example, if memory cell $M_{221}$ is the only selected memory cell in memory array 200, word lines $WL_{10}$-$WL_{13}$ and $WL_{21}$-$WL_{23}$ are unselected word lines, and local bit lines $LBL_{11}$, $LBL_{31}$, $LBL_{12}$-$LBL_{32}$, and $LBL_{13}$-$LBL_{33}$ are unselected local bit lines.

Figure 2B:
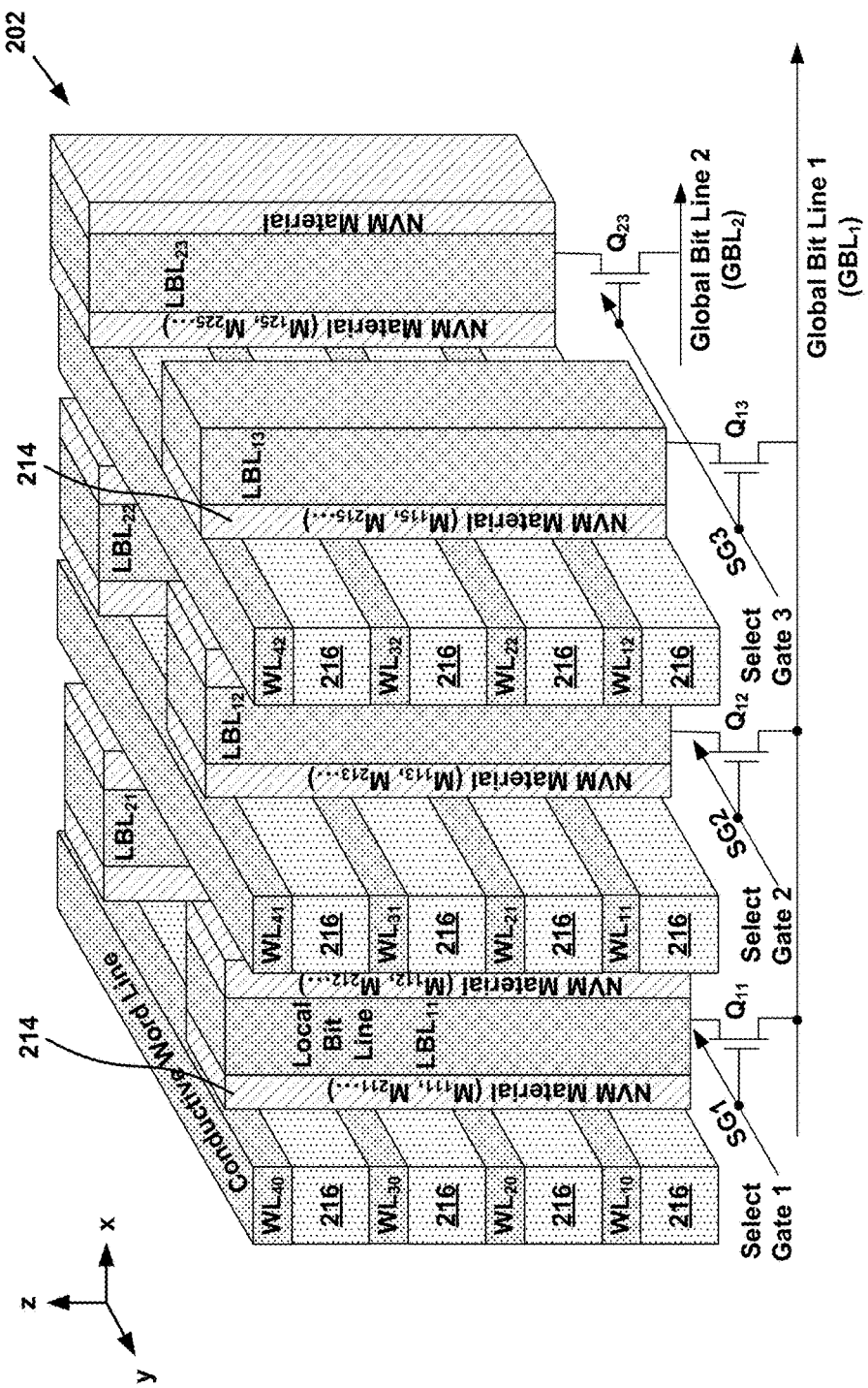
FIG. 2B depicts an embodiment of a portion of a monolithic three-dimensional memory array that includes vertical strips of a non-volatile memory material.
Figure 3A:
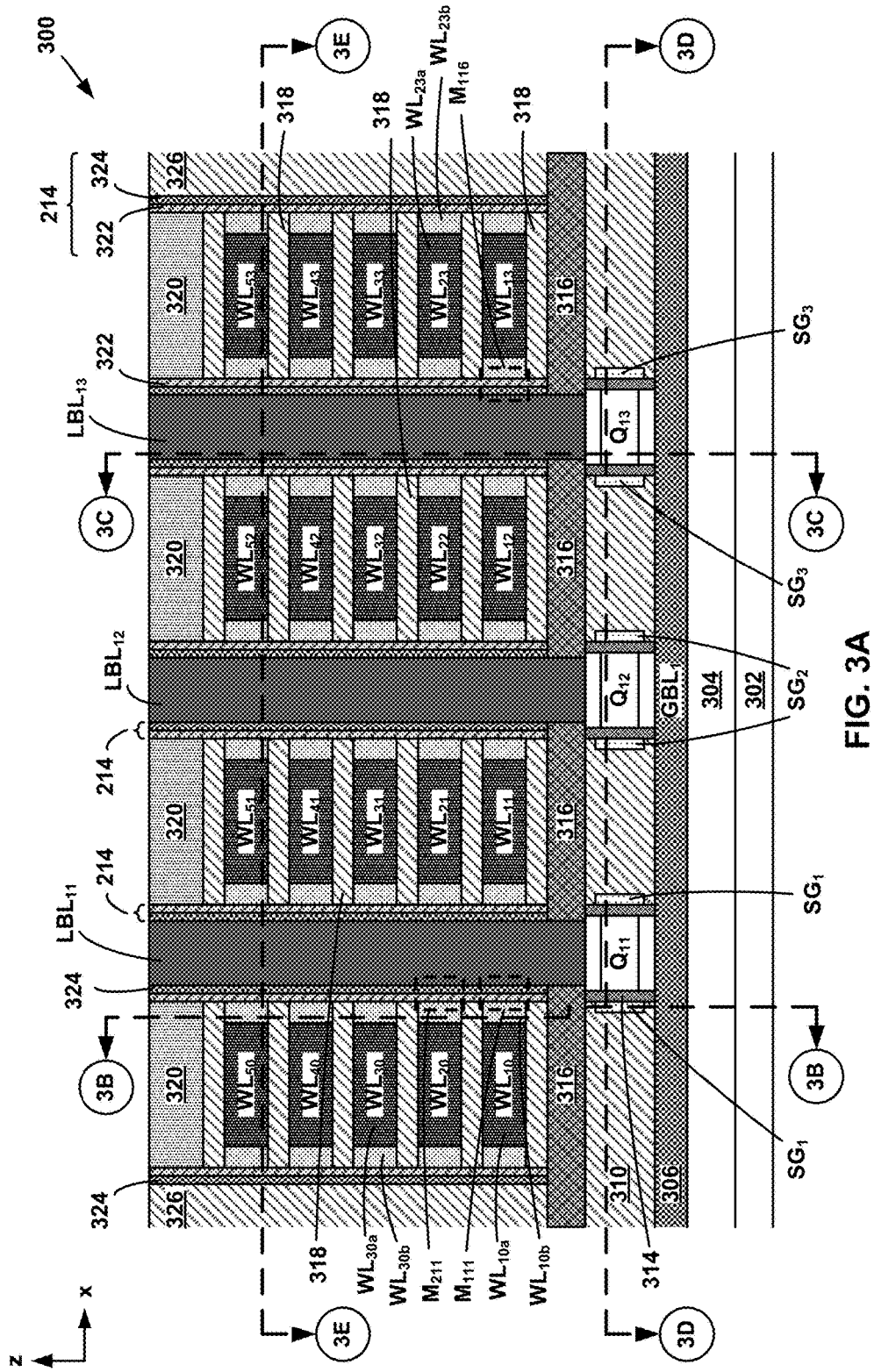
Figure 3B:
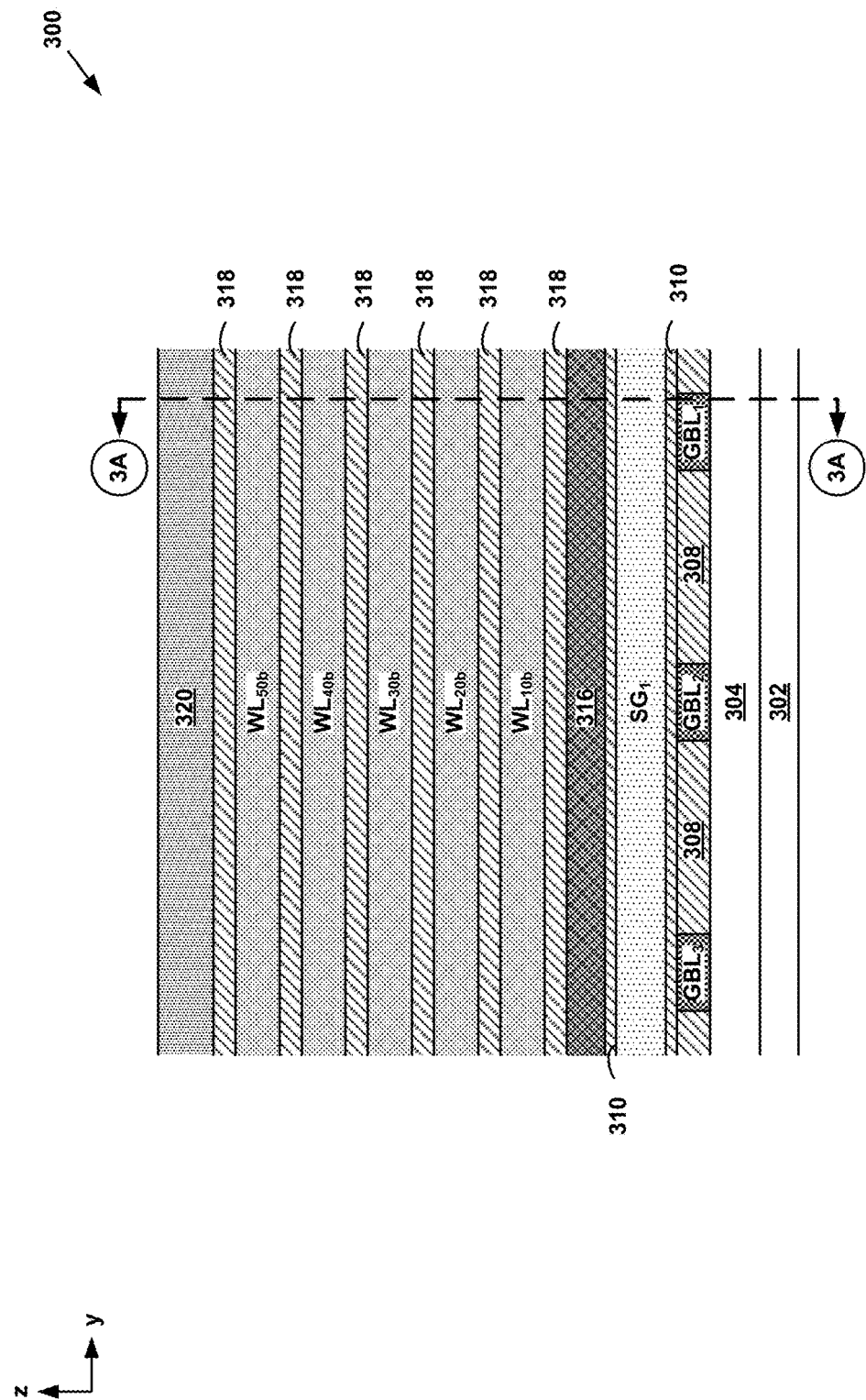
Figure 3D:
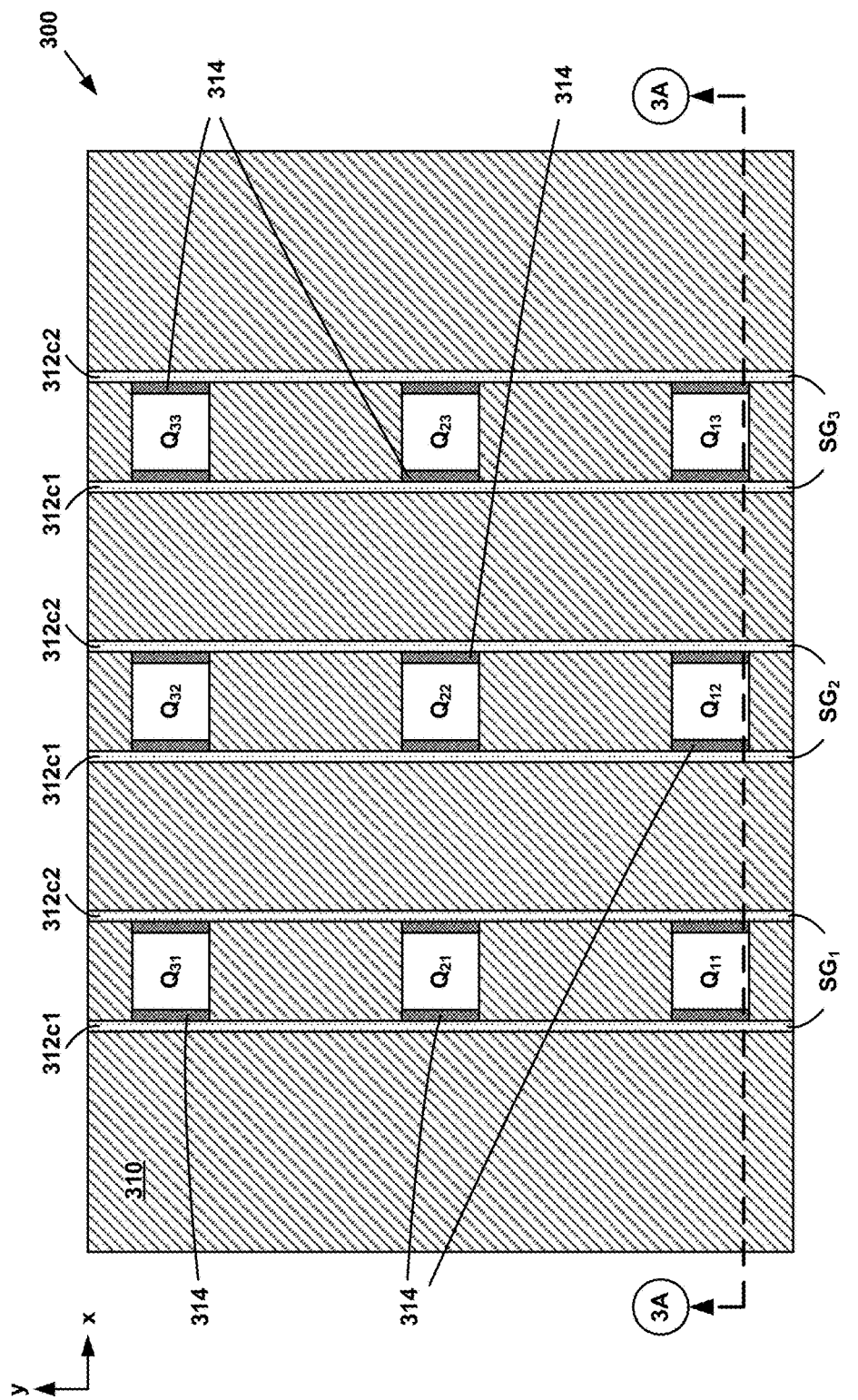
Figure 3E:
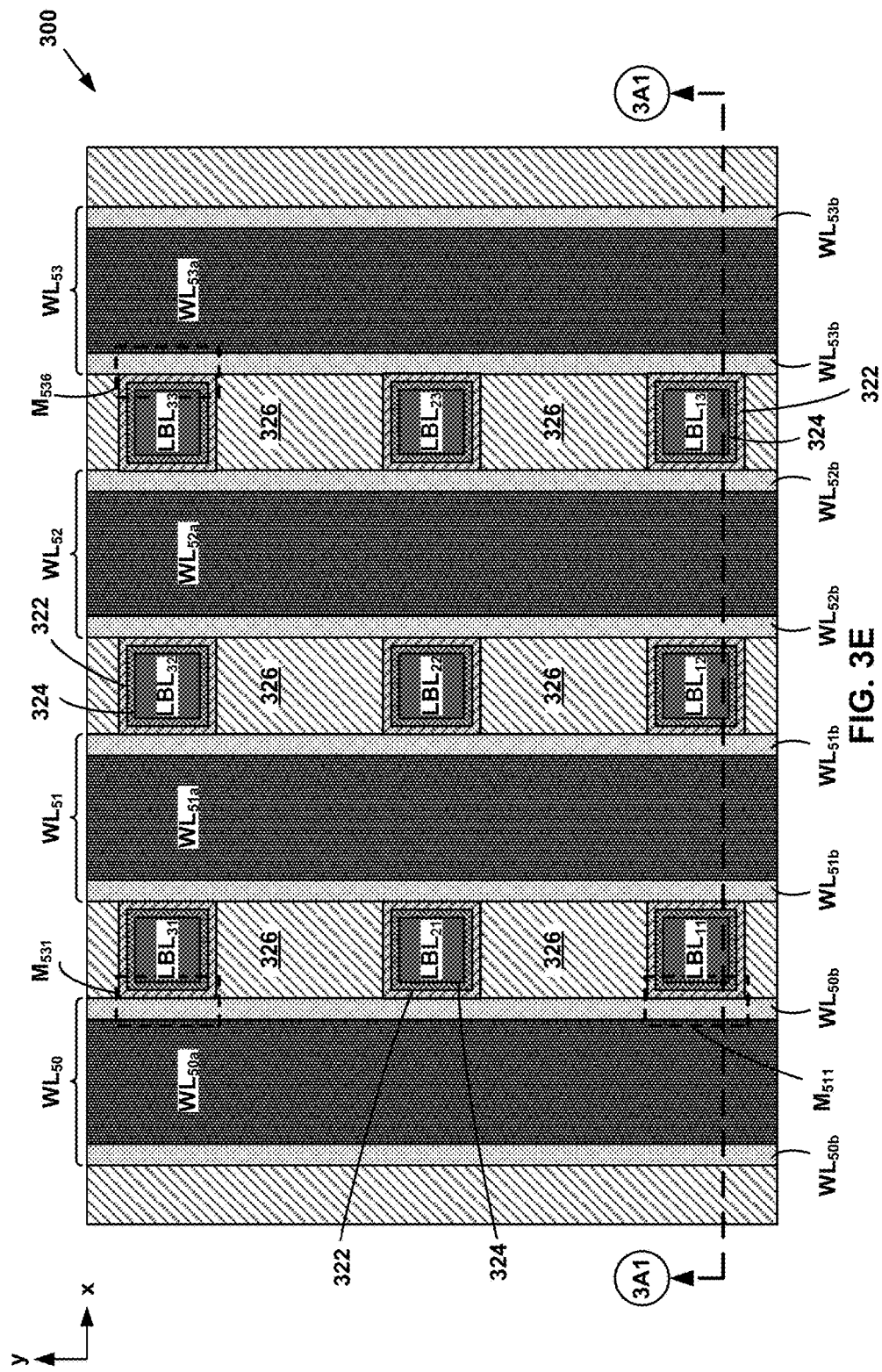

FIG. 2B depicts an embodiment of a portion of a monolithic three-dimensional memory array 202 that includes vertical strips of a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, ..., $WL_{42}$ that are formed in a first direction (e.g., an x-direction), vertical bit lines $LBL_{11}$, $LBL_{32}$, $LBL_{13}$, ..., $LBL_{23}$ that are formed in a second direction perpendicular to the first direction (e.g., a z-direction), and non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $WL_{11}$, $WL_{12}$, ..., $WL_{42}$.

Each non-volatile memory material 214 may include, for example, an oxide material, a reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, or other non-volatile memory material.

Each non-volatile memory material 214 may include a single material layer or multiple material layers. In an embodiment, each non-volatile memory material 214 includes a barrier modulated switching structure. Example barrier modulated switching structures include a semiconductor material layer (e.g., an amorphous silicon layer) adjacent a conductive oxide material layer (e.g., a titanium oxide layer). Other example barrier modulated switching structures include a thin (e.g., less than about 2 nm) barrier oxide material (e.g., an aluminum oxide layer) disposed between a semiconductor material layer (e.g., an amorphous silicon layer) and a conductive oxide material layer (e.g., a titanium oxide layer). Still other example barrier modulated switching structures include a barrier oxide material (e.g., an aluminum oxide layer) disposed adjacent a conductive oxide material layer (e.g., a titanium oxide layer), with no semiconductor material layer (e.g., amorphous silicon) in the barrier modulated switching structure. Such multi-layer embodiments may be used to form BMC memory elements.

In an embodiment, each non-volatile memory material 214 may include a single continuous layer of material that may be used by a plurality of memory cells or devices.

In an embodiment, portions of the non-volatile memory material 214 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, ..., $LBL_{23}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

FIGS. 3A-3E depict various views of an embodiment of a portion of a monolithic three-dimensional memory array 300 that includes vertical strips of a non-volatile memory material. The physical structure depicted in FIGS. 3A-3E may include one implementation for a portion of the monolithic three-dimensional memory array depicted in FIG. 2B.

Monolithic three-dimensional memory array 300 includes vertical bit lines $LBL_{11}$-$LBL_{33}$ arranged in a first direction (e.g., a z-direction), word lines $WL_{10}$, $WL_{11}$, ..., $WL_{53}$ arranged in a second direction (e.g., an x-direction) perpendicular to the first direction, and row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions.

Vertical bit lines $LBL_{11}$-$LBL_{33}$ are disposed above global bit lines $GBL_1$, $GBL_2$, $GBL_3$, which each have a long axis in the second (e.g., x-direction). Person of ordinary skill in the art will understand that monolithic three-dimensional memory arrays, such as monolithic three-dimensional memory array 300 may include more or fewer than twenty word lines, three row select lines, three global bit lines, and nine vertical bit lines.

In an embodiment, global bit lines $GBL_1$, $GBL_2$, $GBL_3$ are disposed above a substrate 302, such as a silicon, germanium, silicon-germanium, undoped, doped, bulk, silicon-on-insulator ("SOI") or other substrate with or without additional circuitry. In an embodiment, an isolation layer 304, such as a layer of silicon dioxide, silicon nitride, silicon oxynitride or any other suitable insulating layer, is formed above substrate 302.

In an embodiment, a first dielectric material layer 308 (e.g., silicon dioxide) and a second dielectric material layer 310 (e.g., silicon dioxide) are formed above isolation layer 304. Global bit lines $GBL_1$, $GBL_2$, $GBL_3$ are disposed above isolation layer 304 and are separated from one another by first dielectric material layer 308.

Vertically-oriented bit line select transistors $Q_{11}$-$Q_{33}$ are disposed above global bit lines $GBL_1$, $GBL_2$, $GBL_3$ and are separated from one another by second dielectric material layer 310. Vertically-oriented bit line select transistors $Q_{11}$-$Q_{13}$ are disposed above and electrically coupled to global bit line $GBL_1$, vertically-oriented bit line select transistors $Q_{21}$-$Q_{23}$ are disposed above and electrically coupled to global bit line $GBL_2$, and vertically-oriented bit line select transistors $Q_{31}$-$Q_{33}$ are disposed above and electrically coupled to global bit line $GBL_3$.

Vertically-oriented bit line select transistors $Q_{11}$-$Q_{33}$ may be field effect transistors, although other transistors types may be used. In an embodiment, each of vertically-oriented bit line select transistors $Q_{31}$-$Q_{33}$ has a height between about 150 nm and about 500 nm. Other height values may be used.

Each of vertically-oriented bit line select transistors $Q_{11}$-$Q_{33}$ has a first terminal 312a (e.g., a drain/source terminal), a second terminal 312b (e.g., a source/drain terminal), a first control terminal 312c1 (e.g., a first gate terminal) and a second control terminal 312c2 (e.g., a second gate terminal). First gate terminal 312c1 and second gate terminal 312c2 may be disposed on opposite sides of the vertically-oriented bit line select transistor. A gate dielectric material 314 (e.g., $SiO_2$) is disposed between first gate terminal 312c1 and first terminal 312a and second terminal 312b, and also is disposed between second gate terminal 312c2 and first terminal 312a and second terminal 312b.

First gate terminal 312c1 may be used to selectively induce a first electrically conductive channel between first terminal 312a and second terminal 312b of the transistor, and second gate terminal 312c2 may be used to selectively induce a second electrically conductive channel between first terminal 312a and second terminal 312b of the transistor. In an embodiment, first gate terminal 312c1 and second gate terminal $312c2$ are coupled together to form a single control terminal $312c$ that may be used to collectively turn ON and OFF the vertically-oriented bit line select transistor.

Row select lines $SG_1$, $SG_2$, $SG_3$ are disposed above global bit lines $GBL_1$, $GBL_2$ and $GBL_3$, and form gate terminals $312c$ of vertically-oriented bit line select transistors $Q_{11}$-$Q_{33}$. In particular, row select line $SG_1$ forms the gate terminals of vertically-oriented bit line select transistors $Q_{11}$, $Q_{21}$ and $Q_{31}$, row select line $SG_2$ forms the gate terminals of vertically-oriented bit line select transistors $Q_{12}$, $Q_{22}$ and $Q_{32}$, and row select line $SG_3$ forms the gate terminals of vertically-oriented bit line select transistors $Q_{13}$, $Q_{23}$ and $Q_{33}$.

A first etch stop layer 316 (e.g., aluminum oxide) is disposed above second dielectric material layer 310. A stack of word lines $WL_{10}$, $WL_{11}$, . . . , $WL_{53}$ is disposed above first etch stop layer 316, with a third dielectric material layer 318 (e.g., silicon dioxide) separating adjacent word lines. A second etch stop layer 320 (e.g., polysilicon) may be formed above the stack of word lines $WL_{10}$, $WL_{11}$, . . . , $WL_{53}$.

Each of word lines $WL_{10}$, $WL_{11}$, . . . , $WL_{53}$ includes a first word line portion $WL_{10a}$, $WL_{11a}$, . . . , $WL_{53a}$, respectively, and a second word line portion $WL_{10b}$, $WL_{11b}$, . . . , $WL_{53b}$, respectively. For example, word line $WL_{10}$ includes a first word line portion $WL_{10a}$ and a second word line portion $WL_{10b}$, word line $WL_{30}$ includes a first word line portion $WL_{30a}$ and a second word line portion $WL_{30b}$, word line $WL_{52}$ includes a first word line portion $WL_{52a}$ and a second word line portion $WL_{52b}$, and so on.

In an embodiment, each first word line portion $WL_{10a}$, $WL_{11a}$, . . . , $WL_{53a}$, includes a first electrically conductive material layer (e.g., titanium nitride, tungsten, tantalum nitride or other similar electrically conductive material, or combination thereof), and each second word line portion $WL_{10b}$, $WL_{11b}$, . . . , $WL_{53b}$ includes a second electrically conductive material layer. In an implementation, each second word line portion $WL_{10b}$, $WL_{11b}$, . . . , $WL_{53b}$ includes a first conductive oxide material, such as aluminum-doped zinc oxide, calcium vanadate, gadolinium oxide, indium tin oxide, lanthanum copper oxide, niobium oxide, niobium doped strontium titanate, strontium ruthenium oxide, strontium vanadate, vanadium oxide, or other similar conductive oxide material, or combination thereof.

In an embodiment, non-volatile memory material 214 is disposed adjacent word lines $WL_{10}$, $WL_{11}$, . . . , $WL_{53}$. In an embodiment, non-volatile memory material 214 is disposed adjacent second word line portion $WL_{10b}$, $WL_{11b}$, . . . , $WL_{53b}$ of word lines $WL_{10}$, $WL_{11}$, . . . , $WL_{53}$, respectively. Non-volatile memory material 214 may be formed in the first direction (e.g., the z-direction). Non-volatile memory material 214 may include, for example, an oxide layer, a reversible resistance-switching material (e.g., one or more metal oxide layers such as nickel oxide, hafnium oxide, or other similar metal oxide materials, a phase change material, a barrier modulated switching structure or other similar reversible resistance-switching memory material), a ferroelectric material, or other non-volatile memory material.

Non-volatile memory material 214 may include a single continuous layer of material that may be used by a plurality of memory cells or devices. For simplicity, non-volatile memory material 214 also will be referred to in the remaining discussion as reversible resistance-switching memory material 214.

Reversible resistance-switching memory material 214 may include a single material layer or multiple material layers. In an embodiment, reversible resistance-switching memory material 214 includes a barrier modulated switching structure. In some embodiments, barrier modulated switching structures include a barrier oxide material layer (e.g., silicon oxide) disposed between a semiconductor material layer (e.g., amorphous silicon) and a conductive oxide material layer (e.g., titanium oxide).

Without wanting to be bound by any particular theory, it is believed that in such barrier modulated switching structures the amorphous silicon layer: (1) limits memory cell current and acts as a resistor for charge transport of electrons and holes through the cell, and (2) serves as a source of the barrier oxide material layer (e.g., a silicon oxide material layer grows during deposition of a titanium oxide material layer on an amorphous silicon layer.

Without wanting to be bound by any particular theory, it is believed that to increase the cell current, the amorphous silicon amorphous silicon layer may be made as thin as possible. Without wanting to be bound by any particular theory, it is believed that one way to make the amorphous silicon layer as thin as possible is to omit the layer completely, as described in the following embodiment.

In an embodiment, reversible resistance-switching memory material 214 includes a barrier modulated switching structure that includes a barrier oxide material layer 322 and a second conductive oxide material layer 324. In an embodiment, barrier oxide material layers 322 are disposed adjacent second word line portions $WL_{10b}$, $WL_{11b}$, . . . , $WL_{53}b$, and second conductive oxide material layers 324 are disposed adjacent vertical bit line $LBL_{11}$-$LBL_{33}$.

In embodiments, barrier oxide material layer 322 has a thickness between about 0.5 nm and about 2 nm, and includes one or more of aluminum oxide, germanium oxide, hafnium oxide, niobium oxide, silicon oxide, strontium titanate, tantalum oxide, yttria-stabilized zirconia, zirconium oxide, or other similar barrier oxide material. In embodiments, second conductive oxide material layer 324 has a thickness between about 5 nm and about 15 nm, and includes one or more of aluminum-doped zinc oxide, aluminum-doped zirconium oxide, cerium oxide, indium tin oxide, niobium-doped strontium titanate, praseodymium calcium manganese oxide, titanium oxide, tungsten oxide, zinc oxide, or other similar conductive oxide material. Other barrier oxide materials, conductive oxide materials, and thicknesses may be used.

In embodiments, each of barrier oxide material layer 322, and second conductive oxide material layer 324 may be amorphous, polycrystalline or nano-crystalline, and each may be formed by chemical vapor deposition (CVD), physical vapor deposition (PVD), atomic layer deposition (ALD), atomic layer deposition nanolaminates, or other method. As described above, a BMC memory cell includes a barrier modulated switching structure.

Vertical bit lines $LBL_{11}$-$LBL_{33}$ are disposed adjacent reversible resistance-switching memory material 214, and are formed of a conductive material (e.g., titanium nitride). In an embodiment, each of vertical bit lines $LBL_{11}$-$LBL_{33}$ includes an adhesion material layer (not shown) disposed adjacent reversible resistance-switching memory material 214. Vertical bit lines $LBL_{11}$-$LBL_{33}$ are separated from one another by a fourth dielectric material layer 326 (e.g., silicon dioxide). In some embodiments, each of a vertical bit lines $LBL_{11}$-$LBL_{33}$ includes a vertical structure (e.g., a rectangular prism, a cylinder, or a pillar), and the vertical strip of reversible resistance-switching memory material 214 may completely or partially surround the vertical structure (e.g., a conformal layer of reversible resistance-switching material surrounding the sides of the vertical structure).

A memory cell is disposed between the intersection of each vertical bit line and each word line. For example, a memory cell $M_{111}$ is disposed between vertical bit line $LBL_{11}$ and word line $WL_{10}$, a memory cell $M_{116}$ is disposed between vertical bit line $LBL_{13}$ and word line $WL_{13}$, a memory cell $M_{511}$ is disposed between vertical bit line $LBL_{11}$ and word line $WL_{50}$, a memory cell $M_{536}$ is disposed between vertical bit line $LBL_{33}$ and word line $WL_{50}$, and so on. In an embodiment, monolithic three-dimensional memory array 300 includes ninety memory cells $M_{111}$, $M_{112}$, . . . , $M_{536}$. Persons of ordinary skill in the art will understand that monolithic three-dimensional memory arrays may include more or fewer than ninety memory cells.

In an example, portions of the reversible resistance-switching memory material 214 may include a part of memory cell $M_{111}$ associated with the cross section between word line $WL_{10}$ and $LBL_{11}$, and a part of memory cell $M_{211}$ associated with the cross section between word line $WL_{20}$ and $LBL_{11}$, and so on.

Each of memory cells $M_{111}$, $M_{112}$, . . . , $M_{536}$ may include a floating gate device, a charge trap device (e.g., using a silicon nitride material), a resistive change memory device, or other type of memory device. Vertically-oriented bit line select transistors $Q_{11}$-$Q_{33}$ may be used to select a corresponding one of vertical bit lines $LBL_{11}$-$LBL_{33}$. Vertically-oriented bit line select transistors $Q_{11}$-$Q_{33}$ may be field effect transistors, although other transistors types may be used.

Thus, the first gate terminal and the second gate terminal of each of vertically-oriented bit line select transistors $Q_{11}$-$Q_{33}$ may be used to turn ON and OFF vertically-oriented bit line select transistors $Q_{11}$-$Q_3$. Without wanting to be bound by any particular theory, for each of vertically-oriented bit line select transistors $Q_{11}$-$Q_{33}$, it is believed that the current drive capability of the transistor may be increased by using both the first gate terminal and the second gate terminal to turn ON the transistor. For simplicity, the first and second gate terminal of each of select transistors $Q_{11}$-$Q_{33}$ will be referred to as a single gate terminal.

Vertically-oriented bit line select transistors $Q_{11}$, $Q_{12}$, $Q_{13}$ are used to selectively connect/disconnect vertical bit lines $LBL_{11}$, $LBL_{12}$, and $LBL_{13}$ to/from global bit line $GBL_1$ using row select lines $SG_1$, $SG_2$, $SG_3$, respectively. In particular, each of vertically-oriented bit line select transistors $Q_{11}$, $Q_{12}$, $Q_{13}$ has a first terminal (e.g., a drain./source terminal) coupled to a corresponding one of vertical bit lines $LBL_{11}$, $LBL_{12}$, and $LBL_{13}$, respectively, a second terminal (e.g., a source/drain terminal) coupled to global bit line $GBL_1$, and a control terminal (e.g., a gate terminal) coupled to row select line $SG_1$, $SG_2$, $SG_3$, respectively.

Row select lines $SG_1$, $SG_2$, $SG_3$ are used to turn ON/OFF vertically-oriented bit line select transistors $Q_{11}$, $Q_{12}$, $Q_{13}$, respectively, to connect/disconnect vertical bit lines $LBL_{11}$, $LBL_{12}$, and $LBL_{13}$, respectively, to/from global bit line $GBL_1$.

Likewise, vertically-oriented bit line select transistors $Q_{11}$, $Q_{21}$, . . . , $Q_{33}$ are used to selectively connect/disconnect vertical bit lines $LBL_{11}$, $LBL_{21}$, and $LBL_{31}$, respectively, to global bit lines $GBL_1$, $GBL_2$, $GBL_3$, respectively, using row select line $SG_1$. In particular, each of vertically-oriented bit line select transistors $Q_{11}$, $Q_{21}$, $Q_{31}$ has a first terminal (e.g., a drain./source terminal) coupled to a corresponding one of vertical bit lines $LBL_{11}$, $LBL_{21}$, and $LBL_{31}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_1$. Row select line $SG_1$ is used to turn ON/OFF vertically-oriented bit line select transistors $Q_{11}$, $Q_{21}$, $Q_{31}$ to connect/disconnect vertical bit lines $LBL_{11}$, $LBL_{21}$, and $LBL_{31}$, respectively, to/from global bit lines $GBL_1$, $GBL_2$, $GBL_3$, respectively.

Similarly, vertically-oriented bit line select transistors $Q_{13}$, $Q_{23}$, $Q_{33}$ are used to selectively connect/disconnect vertical bit lines $LBL_{13}$, $LBL_{23}$, and $LBL_{33}$, respectively to/from global bit lines $GBL_1$, $GBL_2$, $GBL_3$, respectively, using row select line $SG_3$. In particular, each of vertically-oriented bit line select transistors $Q_{13}$, $Q_{23}$, $Q_{33}$ has a first terminal (e.g., a drain./source terminal) coupled to a corresponding one of vertical bit lines $LBL_{13}$, $LBL_{23}$, and $LBL_{33}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_3$. Row select line $SG_3$ is used to turn ON/OFF vertically-oriented bit line select transistors $Q_{13}$, $Q_{23}$, $Q_{33}$ to connect/disconnect vertical bit lines $LBL_{33}$, $LBL_{23}$, and $LBL_{33}$, respectively, to/from global bit lines $GBL_1$, $GBL_2$, $GBL_3$, respectively.

One previously known monolithic three-dimensional memory array, such as monolithic three-dimensional array 202 of FIG. 2B, includes BMC memory cells formed using BMC memory elements disposed between bit lines (sometimes referred to as "top electrodes" of such memory cells) and word lines (sometimes referred to as "bottom electrodes" of such memory cells). In such BMC memory cells, during SET polarization the barrier oxide can experience high electric field stress. Without wanting to be bound by any particular theory, it is believed that such high electric field stress may degrade the barrier oxide and may lead to Frenkel-pair generation which frees oxygen from the barrier oxide. Without wanting to be bound by any particular theory, it is believed that the applied field during SET accelerates the oxygen towards the bottom electrode.

However, during SET when "free" oxygen in the barrier oxide is created and accelerated towards the bottom electrode, it is believed that the oxygen may react with the bottom electrode material and be lost, thereby rapidly degrading the memory cell. As described above, some BMC memory elements include a barrier oxide material (e.g., an aluminum oxide layer) disposed adjacent a second conductive oxide material layer (e.g., a titanium oxide layer), with no semiconductor material layer (e.g., amorphous silicon) in the barrier modulated switching structure.

Technology is described for using bottom electrodes (word lines) that may have little or no oxygen affinity. Without wanting to be bound by any particular theory, it is believed that such bottom electrodes may avoid rapid degradation of BMC memory cells that do not include a semiconductor material layer (e.g., amorphous silicon). Without wanting to be bound by any particular theory, it is believed that using a bottom electrode that may have little or no oxygen affinity may suppress the extraction of free oxygen during SET.

Technology is described for using bottom electrodes (word lines) that include a first conductive oxide material. Without wanting to be bound by any particular theory, it is believed that bottom electrodes (word lines) that include the first conductive oxide material may impede oxygen extraction at the bottom electrode. In addition, without wanting to be bound by any particular theory, it is believed that the first conductive oxide material may be fully oxidized and therefore may not react with free oxygen.

Moreover, without wanting to be bound by any particular theory, it is believed that the electric field in the first conductive oxide may be very low so that the free oxygen ions may not be accelerated into the first conductive oxide.

Additionally, without wanting to be bound by any particular theory, it is believed that the first conductive oxide may form bonds with the oxygen from the barrier oxide, and may avoid a delamination of the bottom electrode from the stack.

Technology is described for forming BMC memory cells that include BMC memory elements disposed between word lines having a first word line portion including a first electrically conductive material layer and a second word line portion including a second electrically conductive material layer, and bit lines including a third electrically conductive material. In an embodiment, each BMC memory element is disposed adjacent the second word line portion.

The first electrically conductive material layer may include titanium nitride, tungsten, tantalum nitride or other similar electrically conductive material, or combination thereof), the second electrically conductive material layer may include a first conductive oxide material, such as strontium ruthenium oxide, gadolinium oxide, niobium doped strontium titanate, niobium oxide, indium tin oxide, aluminum-doped zinc oxide, vanadium oxide, lanthanum copper oxide, strontium vanadate, calcium vanadate, or other similar conductive oxide material, or combination thereof.

Without wanting to be bound by any particular theory, it is believed that if BMC memory cells use word lines having a first word line portion including a first electrically conductive material layer (e.g., titanium nitride) and a second word line portion including a second electrically conductive material layer (e.g., strontium ruthenium oxide) disposed adjacent the BMC memory element, the low field in the bottom electrode may avoid acceleration of free oxygen into the bottom electrode, and (2) a chemistry of the first conductive oxide may impede a reaction with free oxygen and delamination from the rest of the stack.

In particular, referring now to FIGS. 4A1-4J2, an example method of forming a monolithic three-dimensional memory array, such as monolithic three-dimensional array 300 of FIGS. 3A-3E, is described.

With reference to FIGS. 4A1-4A3, substrate 302 is shown as having already undergone several processing steps. Substrate 302 may be any suitable substrate such as a silicon, germanium, silicon-germanium, undoped, doped, bulk, silicon-on-insulator ("SOI") or other substrate with or without additional circuitry. For example, substrate 302 may include one or more n-well or p-well regions (not shown). Isolation layer 304 is formed above substrate 302. In some embodiments, isolation layer 304 may be a layer of silicon dioxide, silicon nitride, silicon oxynitride or any other suitable insulating layer.

Following formation of isolation layer 304, a conductive material layer 306 is deposited over isolation layer 304. Conductive material layer 306 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 306 may include between about 20 nm and about 250 nm of tungsten. Other conductive material layers and/or thicknesses may be used. In some embodiments, an adhesion layer (not shown), such as titanium nitride or other similar adhesion layer material, may be disposed between isolation layer 304 and conductive material layer 306, and/or between conductive material layer 306 and subsequent vertically-oriented bit line select transistors layers.

Persons of ordinary skill in the art will understand that adhesion layers may be formed by PVD or another method on conductive material layers. For example, adhesion layers may be between about 2 nm and about 50 nm, and in some embodiments about 10 nm, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 306, conductive material layer 306 is patterned and etched. For example, conductive material layer 306 may be patterned and etched using conventional lithography techniques, with a soft or hard mask, and wet or dry etch processing. In at least one embodiment, conductive material layer 306 is patterned and etched to form global bit lines $GBL_1$, $GBL_2$, $GBL_3$. Example widths for global bit lines $GBL_1$, $GBL_2$, $GBL_3$ and/or spacings between global bit lines $GBL_1$, $GBL_2$, $GBL_3$ range between about 20 nm and about 100 nm, although other conductor widths and/or spacings may be used.

After global bit lines $GBL_1$, $GBL_2$, $GBL_3$ have been formed, a first dielectric material layer 308 is formed over substrate 302 to fill the voids between global bit lines $GBL_1$, $GBL_2$, $GBL_3$. For example, approximately 300-700 nm of silicon dioxide may be deposited on the substrate 302 and planarized using chemical mechanical polishing or an etch-back process to form a planar surface 400. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1$, $GBL_2$, $GBL_3$ may be formed using a damascene process in which first dielectric material layer 308 is formed, patterned and etched to create openings or voids for global bit lines $GBL_1$, $GBL_2$, $GBL_3$. The openings or voids then may be filled with conductive layer 306 (and/or a conductive seed, conductive fill and/or barrier layer if needed). Conductive material layer 306 then may be planarized to form planar surface 400.

Following planarization, the semiconductor material used to form vertically-oriented bit line select transistors $Q_{11}$-$Q_{33}$ is formed over planar surface 400 of substrate 302. In some embodiments, each vertically-oriented bit line select transistor is formed from a polycrystalline semiconductor material such as polysilicon, an epitaxial growth silicon, a polycrystalline silicon-germanium alloy, polygermanium or any other suitable material. Alternatively, vertically-oriented bit line select transistors $Q_{11}$-$Q_{33}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented bit line select transistor $Q_{11}$-$Q_{33}$ may include a first region (e.g., p+ polysilicon), a second region (e.g., intrinsic polysilicon) and a third region (e.g., p+ polysilicon) to form drain/source, body, and source/drain regions, respectively, of a vertical FET. For example, a heavily doped p+ polysilicon layer 402 may be deposited on planar surface 400. P+ silicon may be either deposited and doped by ion implantation or may be doped in situ during deposition to form p+ polysilicon layer 402.

For example, an intrinsic silicon layer may be deposited on planar surface 400, and a blanket p-type implant may be employed to implant boron a predetermined depth within the intrinsic silicon layer. Example implantable molecular ions include $BF_2$, $BF_3$, B and the like. In some embodiments, an implant dose of about 1-10×10$^{13}$ ions/cm$^2$ may be employed. Other implant species and/or doses may be used. Further, in some embodiments, a diffusion process may be employed. In an embodiment, the resultant p+ polysilicon layer 402 has a thickness of from about 5 nm to about 30 nm, although other layer thicknessess may be used.

Following formation of p+ polysilicon layer 402, an intrinsic (undoped) or lightly doped polysilicon layer 404 is deposited on p+ polysilicon layer 402. In some embodiments, intrinsic layer 404 is in an amorphous state as deposited. In other embodiments, intrinsic layer 404 is in a polycrystalline state as deposited. CVD or another suitable process may be employed to deposit intrinsic layer 404. In an embodiment, intrinsic layer 404 has a thickness between about 100 nm to about 300 nm, although other layer thicknesses may be used.

After deposition of intrinsic layer 404, a p+ polysilicon layer 406 may be formed over intrinsic layer 404. P-type silicon may be either deposited and doped by ion implantation or may be doped in situ during deposition to form a p+ polysilicon layer 406.

For example, an intrinsic silicon layer may be deposited on intrinsic layer 404, and a blanket p-type implant may be employed to implant boron a predetermined depth within the intrinsic silicon layer. Example implantable molecular ions include BF$_2$, BF$_3$, B and the like. In some embodiments, an implant dose of about 1-10×10$^{13}$ ions/cm$^2$ may be employed. Other implant species and/or doses may be used. Further, in some embodiments, a diffusion process may be employed. In an embodiment, the resultant p+ polysilicon layer 406 has a thickness of from about 5 nm to about 30 nm, although other p-type silicon layer sizes may be used.

Following formation of p+ polysilicon layer 406, silicon layers 402, 404 and 406 are patterned and etched to form rows of semiconductor material. For example, silicon layers 402, 404 and 406 may be patterned and etched using conventional lithography techniques, with wet or dry etch processing.

Silicon layers 402, 404 and 406 may be patterned and etched in a single pattern/etch procedure or using separate pattern/etch steps. Any suitable masking and etching process may be used to form semiconductor rows. For example, silicon layers may be patterned with about 0.1 to about 1.5 micron of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, the semiconductor rows may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A gate dielectric material layer 314 is deposited conformally over substrate 302, and forms on sidewalls of the semiconductor rows. For example, between about 3 nm to about 10 nm of silicon dioxide may be deposited. Other dielectric materials such as silicon nitride, silicon oxynitride, low K dielectrics, etc., and/or other dielectric material layer thicknesses may be used.

Gate electrode material is deposited over the semiconductor rows and gate dielectric material layer 314 to fill the voids between the semiconductor rows. For example, approximately 10 nm to about 20 nm of titanium nitride or other similar metal, a highly-doped semiconductor, such as n+ polysilicon, p+ polysilicon, or other similar conductive material may be deposited. The as-deposited gate electrode material is subsequently etched back to form row select lines SG$_1$, SG$_2$, SG$_3$.

In an embodiment, silicon layers 402, 404 and 406 in the semiconductor rows are patterned and etched to form vertical transistor pillars disposed above global bit lines GBL$_1$, GBL$_2$, GBL$_3$. The vertical transistor pillars will be used to form vertically-oriented bit line select transistors Q$_{11}$-Q$_{33}$. In an embodiment, gate dielectric material layer 314 also is etched at the same time to trim gate dielectric material layers 314 to the same width as the vertical transistor pillars.

A second dielectric material layer 310 is deposited over substrate 302. For example, approximately 500 nm to about 800 nm of silicon dioxide may be deposited and planarized using chemical mechanical polishing or an etch-back process to form planar top surface 408, resulting in the structure shown in FIGS. 4A1-4A3. Other dielectric materials and/or thicknesses may be used.

Planar surface 408 includes exposed top surfaces of vertically-oriented bit line select transistors Q$_{11}$-Q$_{33}$ and gate dielectric material layer 314 separated by second dielectric material layer 310. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

A first etch stop layer 316 is formed over planar top surface 408. First etch stop layer 412 may include any suitable etch stop layer formed by any suitable method (e.g., CVD, PVD, etc.). In an embodiment, first etch stop layer 412 may include between about 5 nm and about 50 nm of silicon nitride. Other etch stop layer materials and/or thicknesses may be used.

A stack of alternating layers of third dielectric material layer 318 and first electrically conductive material layer 410 are formed over planar top surface 408. Third dielectric material layers 318 may be silicon dioxide or other dielectric material formed by any suitable method (e.g., CVD, PVD, etc.). First electrically conductive material layer 410 may be titanium nitride, tungsten, tantalum nitride, or other similar conductive material formed by any suitable method (e.g., CVD, PVD, etc.).

In an embodiment, each third dielectric material layer 414 may be between about 5 nm and about 25 nm of SiO$_2$, and each first electrically conductive material layer 410 may be between about 5 nm and about 30 nm of titanium nitride. Other dielectric materials and/or thicknesses, and/or other first electrically conductive materials and/or thicknesses may be used. In an embodiment, five first electrically conductive material layers 410 are formed over substrate 302. More or fewer than five first electrically conductive material layers 410 may be used.

Next, a second etch stop layer 320 is formed over substrate 302, resulting in the structure shown in FIGS. 4B1-4B2. Second etch stop layer 320 may include any suitable etch stop layer formed by any suitable method (e.g., CVD, PVD, etc.). In an embodiment, second etch stop layer 320 may be between about 5 nm and about 50 nm of polysilicon. Other etch stop layer materials and/or thicknesses may be used.

Next, second etch stop layer 320, third dielectric material layers 318, and first electrically conductive material layers 410 are patterned and etched to form rows 412, with voids 414 separating rows 412, resulting in the structure shown in FIGS. 4C1-4C3. Each of rows 412 may be between about 20 nm and about 100 nm wide, although other widths may be used. Voids 414 may be between about 10 nm and about 80 nm wide, although other widths may be used.

Next, an etch is performed to form recesses 416 at ends of each first electrically conductive material layer 410, resulting in the structure shown in FIGS. 4D1-4D2. Each of recesses 416 may have a depth D of between about 5 nm and about 50 nm, although other depths may be used.

A second electrically conductive material layer 418 is deposited conformally over rows 412, filling recesses 416. In an embodiment, second electrically conductive material layer 418 is between about 5 nm and about 50 nm of a conductive oxide material, such as aluminum-doped zinc oxide, calcium vanadate, gadolinium oxide, indium tin oxide, lanthanum copper oxide, niobium oxide, niobium doped strontium titanate, strontium ruthenium oxide, strontium vanadate, vanadium oxide, or other similar conductive oxide material, or combination thereof. Other thicknesses may be used. Second electrically conductive material layer 418 may be formed by any suitable method (e.g., CVD, PVD, etc.)

An anisotropic etch is used to remove lateral portions of second electrically conductive material layer 418, leaving only sidewall portions of second electrically conductive material layer 418 in recesses 416, resulting in the structure shown in FIG. 4E1-4E3.

A fourth dielectric material 326 is deposited over substrate 302, filling voids 414 between rows 412. For example, approximately 300-700 nm of silicon dioxide may be deposited on the substrate 302 and planarized using chemical mechanical polishing or an etchback process to form a planar surface 420, resulting in the structure shown in FIGS. 4F1-4F3. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Next, fourth dielectric material 326 is patterned and etched to first etch stop layer 316 to form holes 422 disposed above vertically-oriented bit line select transistors $Q_{11}$-$Q_{33}$, resulting in the structure shown in FIGS. 4G1-4G4. Although holes 422 are shown having a rectangular shape, other shapes may be used. In an embodiment, holes 422 may have a width and a length of between about 20 nm and about 100 nm. Other widths may be used.

A nonvolatile memory material layer 214 is deposited conformally over substrate 302. Non-volatile memory material 214 may include, for example, an oxide layer, a reversible resistance-switching material (e.g., one or more metal oxide layers such as nickel oxide, hafnium oxide, or other similar metal oxide materials, a phase change material, a barrier modulated switching structure or other similar reversible resistance-switching memory material), a ferroelectric material, or other nonvolatile memory material.

In an embodiment, each non-volatile memory material 214 includes a barrier modulated switching structure that includes a barrier oxide material layer 322 and a second conductive oxide material layer 324. In embodiments, barrier oxide material layer 322 includes one or more of aluminum oxide, germanium oxide, hafnium oxide, niobium oxide, silicon oxide, strontium titanate, tantalum oxide, yttria-stabilized zirconia, zirconium oxide, or other similar barrier oxide material. In embodiments, second conductive oxide material layer 324 has a thickness between about 5 nm and about 15 nm, and includes one or more of aluminum-doped zinc oxide, aluminum-doped zirconium oxide, cerium oxide, indium tin oxide, niobium-doped strontium titanate, praseodymium calcium manganese oxide, titanium oxide, tungsten oxide, zinc oxide, or other similar conductive oxide material. Other barrier oxide materials, conductive oxide materials, and thicknesses may be used.

In an embodiment, between about 0.5 nm and about 2 nm of aluminum oxide may be deposited to form barrier oxide material layer 322, and between about 5 nm and about 15 nm of titanium oxide may be deposited over barrier oxide material layer 322 to form second conductive oxide material layer 324. Barrier oxide material layer 322 and second conductive oxide material layer 324 may be amorphous, polycrystalline or nano-crystalline, and each may be formed by CVD, PVD, ALD, atomic layer deposition nanolaminates, or other method. Other barrier oxide materials, conductive oxide materials and/or thicknesses may be used.

An anisotropic etch is used to remove lateral portions of barrier oxide material layer 322 and second conductive oxide material 324, leaving only sidewall portions of barrier oxide material layer 322 and second conductive oxide material 324, resulting in the structure shown in FIGS. 4H1-4H2.

Next, first etch stop layer 316 is patterned and etched to expose top surfaces of bit line select transistors $Q_{11}$-$Q_{31}$, resulting in the structure shown in FIGS. 4I1-4I2.

Next, a third conductive material (e.g., titanium nitride, tantalum nitride, titanium carbide, tantalum carbide, or other conductive material) is deposited over substrate 302, filling holes 422 and forming vertical bit lines $LBL_{11}$-$LBL_{33}$. The structure is then planarized using chemical mechanical polishing or an etch-back process, resulting in the structure shown in FIGS. 4J1-4J2.

Thus, as described above, one embodiment of the disclosed technology includes a method that includes forming a word line above a substrate, forming a bit line above the substrate, forming a nonvolatile memory material between the word line and the bit line, and forming a memory cell including the nonvolatile memory material at an intersection of the bit line and the word line. The word line is disposed in a first direction, and includes a first word line portion and a second word line portion. The second word line portion includes a first conductive oxide material. The bit line is disposed in a second direction perpendicular to the first direction. The nonvolatile memory material includes a barrier oxide material layer and a second conductive oxide material layer, with the barrier oxide material layer disposed adjacent the second word line portion.

One embodiment of the disclosed technology includes a method including forming a word line layer above a substrate, forming a dielectric material above the substrate, forming a hole in the dielectric material, forming a nonvolatile memory material on a sidewall of the hole, forming a local bit line in the hole, and forming a memory cell including the nonvolatile memory material at an intersection of the local bit line and the word line layer. The word line layer is disposed in a first direction, and includes a first word line portion and a second word line portion. The second word line portion includes a first conductive oxide material. The hole is disposed in a second direction perpendicular to the first direction. The nonvolatile memory material includes a barrier oxide material layer and a second conductive oxide material layer, with the barrier oxide material layer disposed adjacent the second word line portion.

One embodiment of the disclosed technology includes a method of forming a monolithic three-dimensional memory array, the method including forming a stack of first electrically conductive material layers above a substrate, etching the stack of first electrically conductive material layers to form a row of first electrically conductive material layers, etching a recess in each of the first electrically conductive material layers, forming a second electrically conductive material layer in each of the recesses, forming a dielectric material above a substrate and adjacent the row of first electrically conductive material layers, forming a hole in the dielectric material, forming a nonvolatile memory material on a sidewall of the hole, forming a local bit line in the hole, and forming an array of memory cells, each memory cell including the nonvolatile memory material at an intersection of the local bit line and the second electrically conductive material in a corresponding one of the recesses. The second electrically conductive material layer includes a first conductive oxide material. The hole is disposed adjacent the row of first electrically conductive material layers. The nonvolatile memory material includes a barrier oxide material layer and a second conductive oxide material layer, with the barrier oxide material layer disposed adjacent the second electrically conductive material in each of the recesses.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:
   forming a word line above a substrate, the word line disposed in a first direction, the word line comprising a first word line portion and a second word line portion, wherein the second word line portion comprises a first conductive oxide material;
   forming a bit line above the substrate, the bit line disposed in a second direction perpendicular to the first direction;
   forming a nonvolatile memory material between the word line and the bit line, the nonvolatile memory material comprising a barrier oxide material layer and a second conductive oxide material layer, the barrier oxide material layer disposed adjacent the second word line portion; and
   forming a memory cell comprising the nonvolatile memory material at an intersection of the bit line and the word line.

2. The method of claim 1, further comprising:
   forming a plurality of word lines above the substrate, each of the word lines disposed in the first direction and comprising a corresponding first word line portion and a corresponding second word line portion; and
   forming a plurality of memory cells comprising the nonvolatile memory material, each of the memory cells formed at an intersection of the bit line and a corresponding one of the word lines.

3. The method of claim 1, further comprising:
   forming a plurality of bit lines above the substrate, each of the bit lines disposed in the second direction;
   forming the nonvolatile memory material between the word line and each of the bit lines; and
   forming a plurality of memory cells comprising the nonvolatile memory material, each of the memory cells formed at an intersection of the word line and a corresponding one of the bit lines.

4. The method of claim 1, further comprising forming a vertically-oriented transistor above the substrate, and wherein forming the bit line comprises forming the bit line above the vertically-oriented transistor.

5. The method of claim 1, further comprising:
   forming a global bit line above the substrate, the global bit line disposed in a third direction perpendicular to the first direction and the second direction; and
   forming a transistor between the bit line and the global bit line.

6. The method of claim 5, wherein the transistor comprises a vertically-oriented transistor.

7. The method of claim 1, wherein forming the word line comprises:
   forming a first electrically conductive material layer above the substrate;
   etching a recess in the first electrically conductive material layer; and
   forming the first conductive oxide material in the recess.

8. The method of claim 1, wherein:
   the barrier oxide material layer comprises one or more of aluminum oxide, germanium oxide, hafnium oxide, niobium oxide, silicon oxide, strontium titanate, tantalum oxide, yttria-stabilized zirconia, zirconium oxide; and
   the second conductive oxide material layer comprises one or more of aluminum-doped zinc oxide, aluminum-doped zirconium oxide, cerium oxide, indium tin oxide, niobium-doped strontium titanate, praseodymium calcium manganese oxide, titanium oxide, tungsten oxide, and zinc oxide.

9. The method of claim 1, wherein:
   the first word line portion comprises one or more of titanium nitride, tungsten, and tantalum nitride; and
   the second word line portion comprises one or more of aluminum-doped zinc oxide, calcium vanadate, gadolinium oxide, indium tin oxide, lanthanum copper oxide, niobium oxide, niobium doped strontium titanate, strontium ruthenium oxide, strontium vanadate, and vanadium oxide.

10. The method of claim 1, wherein the local bit line comprises one or more of titanium nitride, tantalum nitride, tantalum carbide, and titanium carbide.

11. A method comprising:
    forming a word line layer above a substrate, the word line layer disposed in a first direction, the word line layer comprising a first word line portion and a second word line portion, wherein the second word line portion comprises a first conductive oxide material;

forming a dielectric material above the substrate;

forming a hole in the dielectric material, the hole disposed in a second direction perpendicular to the first direction;

forming a nonvolatile memory material on a sidewall of the hole, the nonvolatile memory material comprising a barrier oxide material layer and a second conductive oxide material layer, the barrier oxide material layer disposed adjacent the second word line portion of the word line layer;

forming a local bit line in the hole; and forming a memory cell comprising the nonvolatile memory material at an intersection of the local bit line and the word line layer.

12. The method of claim 11, further comprising:

forming a plurality of word line layers above the substrate, each of the word line layers disposed in the first direction and comprising a corresponding first word line portion and a corresponding second word line portion; and forming a plurality of memory cells comprising the nonvolatile memory material, each of the memory cells formed at an intersection of the local bit line and a corresponding one of the word line layers.

13. The method of claim 11, further comprising:

forming a plurality of holes in the dielectric material, each of the plurality of holes disposed in the second direction;

forming the nonvolatile memory material on a sidewall of each of the holes;

forming a plurality of local bit lines, each local bit line disposed in a corresponding one of the holes; and forming a plurality of memory cells comprising the nonvolatile memory material, each of the memory cells formed at an intersection of the word line layer and a corresponding one of the local bit lines.

14. The method of claim 11, wherein forming the word line layer comprises:

forming a first electrically conductive material layer above the substrate;

etching a recess in the first electrically conductive material layer; and forming the first conductive oxide material in the recess.

15. The method of claim 11, further comprising:

forming a global bit line above the substrate, the global bit line disposed in a third direction perpendicular to the first direction and the second direction; and forming a transistor between the local bit line and the global bit line.

16. The method of claim 11, wherein:

the barrier oxide material layer comprises one or more of aluminum oxide, germanium oxide, hafnium oxide, niobium oxide, silicon oxide, strontium titanate, tantalum oxide, yttria-stabilized zirconia, zirconium oxide; and the second conductive oxide material layer comprises one or more of aluminum-doped zinc oxide, aluminum-doped zirconium oxide, cerium oxide, indium tin oxide, niobium-doped strontium titanate, praseodymium calcium manganese oxide, titanium oxide, tungsten oxide, and zinc oxide.

17. The method of claim 11, wherein:

the first word line portion comprises one or more of titanium nitride, tungsten, and tantalum nitride; and the second word line portion comprises one or more of aluminum-doped zinc oxide, calcium vanadate, gadolinium oxide, indium tin oxide, lanthanum copper oxide, niobium oxide, niobium doped strontium titanate, strontium ruthenium oxide, strontium vanadate, and vanadium oxide.

18. The method of claim 11, wherein the local bit line comprises one or more of titanium nitride, tantalum nitride, tantalum carbide, and titanium carbide.

19. A method of forming a monolithic three-dimensional memory array, the method comprising:

forming a stack of first electrically conductive material layers above a substrate;

etching the stack of first electrically conductive material layers to form a row of first electrically conductive material layers;

etching a recess in each of the first electrically conductive material layers;

forming a second electrically conductive material layer in each of the recesses, the second electrically conductive material layer comprising a first conductive oxide material;

forming a dielectric material above a substrate and adjacent the row of first electrically conductive material layers;

forming a hole in the dielectric material, the hole disposed adjacent the row of first electrically conductive material layers;

forming a nonvolatile memory material on a sidewall of the hole, the nonvolatile memory material including a barrier oxide material layer and a second conductive oxide material layer, the barrier oxide material layer disposed adjacent the second electrically conductive material in each of the recesses;

forming a local bit line in the hole; and forming an array of memory cells, each memory cell comprising the nonvolatile memory material at an intersection of the local bit line and the second electrically conductive material in a corresponding one of the recesses.

20. The method of claim 19, wherein:

the barrier oxide material layer comprises one or more of aluminum oxide, germanium oxide, hafnium oxide, niobium oxide, silicon oxide, strontium titanate, tantalum oxide, yttria-stabilized zirconia, zirconium oxide; and the second conductive oxide material layer comprises one or more of aluminum-doped zinc oxide, aluminum-doped zirconium oxide, cerium oxide, indium tin oxide, niobium-doped strontium titanate, praseodymium calcium manganese oxide, titanium oxide, tungsten oxide, and zinc oxide.

* * * * *